(12) United States Patent
Akutsu et al.

(10) Patent No.: US 10,714,444 B2
(45) Date of Patent: Jul. 14, 2020

(54) ANISOTROPIC CONDUCTIVE FILM

(71) Applicant: DEXERIALS CORPORATION, Tokyo (JP)

(72) Inventors: Yasushi Akutsu, Utsunomiya (JP); Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/728,554

(22) Filed: Dec. 27, 2019

(65) Prior Publication Data

US 2020/0144214 A1 May 7, 2020

Related U.S. Application Data

(63) Continuation of application No. 16/096,255, filed as application No. PCT/JP2017/016245 on Apr. 24, 2017, now Pat. No. 10,553,554.

(30) Foreign Application Priority Data

May 5, 2016 (JP) .................................. 2016-092901
Apr. 23, 2017 (JP) .................................. 2017-084914

(51) Int. Cl.
  *H01L 23/00* (2006.01)
  *H01L 23/29* (2006.01)
  *C09J 9/02* (2006.01)

(52) U.S. Cl.
  CPC ................. *H01L 24/29* (2013.01); *C09J 9/02* (2013.01); *H01L 23/293* (2013.01); *H01L 24/27* (2013.01);

(Continued)

(58) Field of Classification Search
  CPC ........... H01L 2224/73204; H01L 24/73; H01L 24/14; H01L 24/13; H01L 2224/13013; H01L 2224/14135; H01L 2224/32225
  See application file for complete search history.

(56) References Cited

U.S. PATENT DOCUMENTS

2016/0168428 A1* 6/2016 Shinohara ................ C09J 11/04
  428/206

FOREIGN PATENT DOCUMENTS

JP 2003-286457 A 10/2003
JP 2010-251337 A 11/2010
(Continued)

OTHER PUBLICATIONS

Jul. 25, 2017 International Search Report issued in International Patent Application No. PCT/JP2017/016245.

(Continued)

*Primary Examiner* — Kyoung Lee
(74) *Attorney, Agent, or Firm* — Oliff PLC

(57) ABSTRACT

An anisotropic conductive film which can be used as a standard product as long as no problems arise in anisotropic conductive connections, even in a case where omissions are present in a prescribed disposition of conductive particles, includes a regular disposition region in which conductive particles are disposed regularly in an insulating resin binder, and has a length of 5 m or greater. A standard region including no sections with more than a prescribed number of consecutive omissions in conductive particles is present in the regular disposition region over a prescribed width in a short-side direction of the anisotropic conductive film and at least a prescribed length in a long-side direction of the anisotropic conductive film.

19 Claims, 6 Drawing Sheets

(52) U.S. Cl.
CPC .............. *H01L 24/83* (2013.01); *H01L 24/13* (2013.01); *H01L 24/14* (2013.01); *H01L 24/32* (2013.01); *H01L 24/73* (2013.01); *H01L 2224/13013* (2013.01); *H01L 2224/13144* (2013.01); *H01L 2224/14135* (2013.01); *H01L 2224/14155* (2013.01); *H01L 2224/16227* (2013.01); *H01L 2224/27003* (2013.01); *H01L 2224/2711* (2013.01); *H01L 2224/2712* (2013.01); *H01L 2224/2741* (2013.01); *H01L 2224/27334* (2013.01); *H01L 2224/2929* (2013.01); *H01L 2224/29078* (2013.01); *H01L 2224/29082* (2013.01); *H01L 2224/29083* (2013.01); *H01L 2224/29499* (2013.01); *H01L 2224/32225* (2013.01); *H01L 2224/73204* (2013.01); *H01L 2224/83203* (2013.01); *H01L 2224/83851* (2013.01)

(56) References Cited

FOREIGN PATENT DOCUMENTS

| | | |
|---|---|---|
| JP | 2010-257983 A | 11/2010 |
| JP | 4887700 B2 | 2/2012 |
| JP | 5147048 B2 | 2/2013 |
| JP | 2015-501506 A | 1/2015 |
| JP | 2015-025104 A | 2/2015 |
| JP | 2016-066573 A | 4/2016 |
| KR | 10-2007-0023104 A | 2/2007 |

OTHER PUBLICATIONS

Jul. 25, 2017 Written Opinion of the International Searching Authority issued in International Patent Application No. PCT/JP2017/016245.

Jun. 12, 2018 Written Opinion of the International Preliminary Examining Authority issued in International Patent Application No. PCT/JP2017/016245.

Aug. 29, 2018 International Preliminary Report on Patentability issued in International Patent Application No. PCT/JP2017/016245.

Aug. 19, 2019 Office Action issued in Korean Patent Application No. 10-2018-7021397.

Sep. 20, 2019 Office Action issued in Chinese Patent Application No. 201780025075.7.

\* cited by examiner

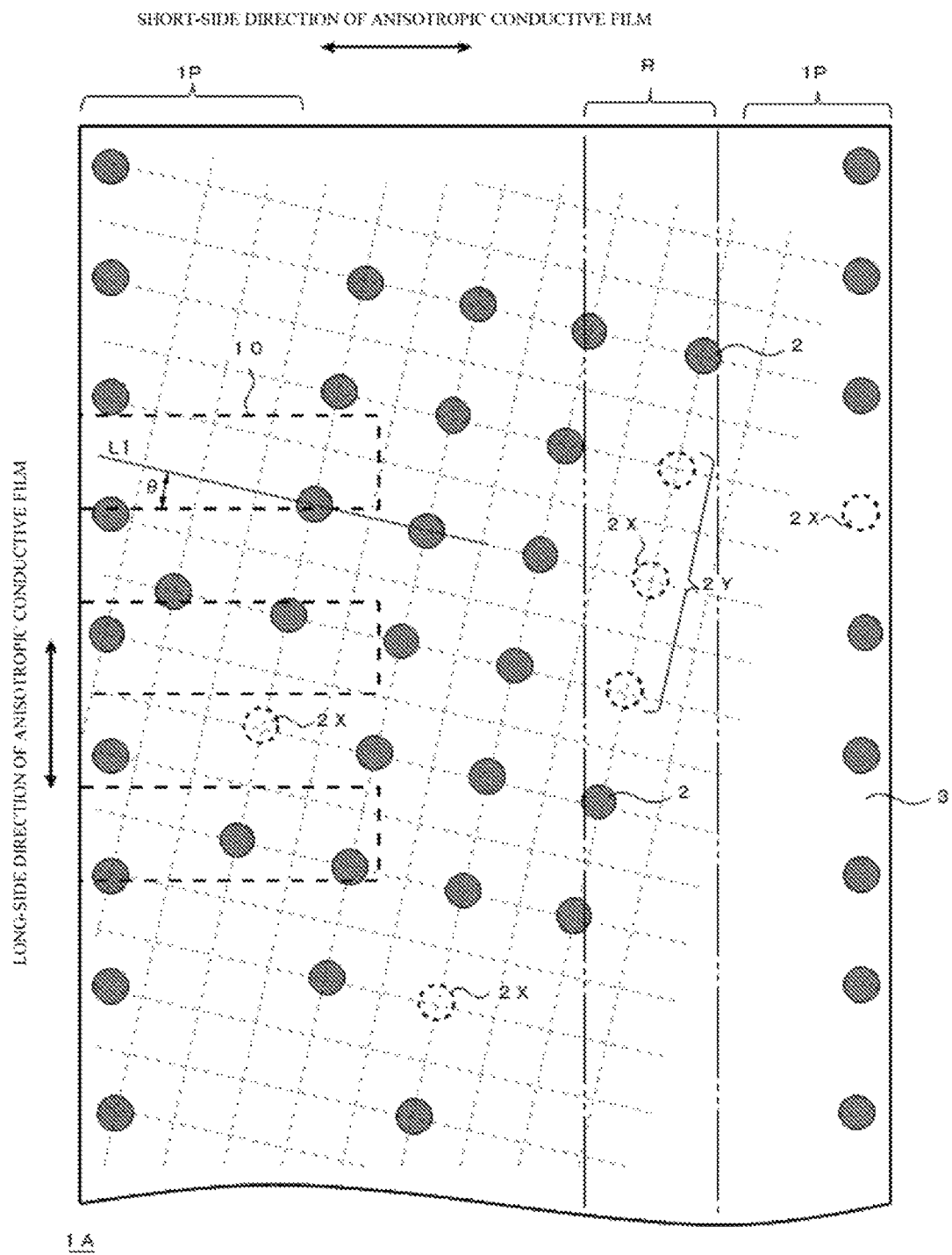
[FIG. 1]

[FIG. 2]
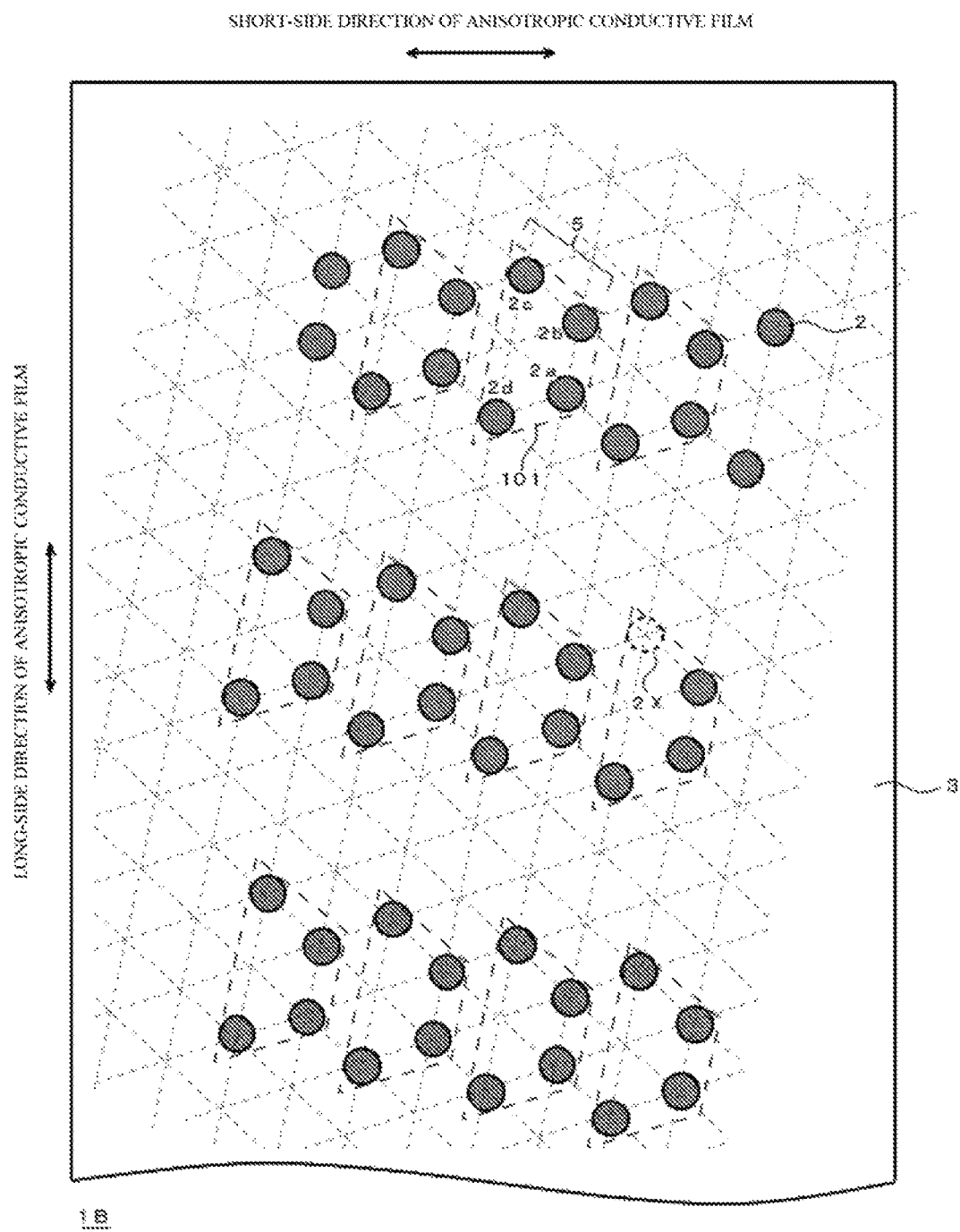

[FIG. 3]
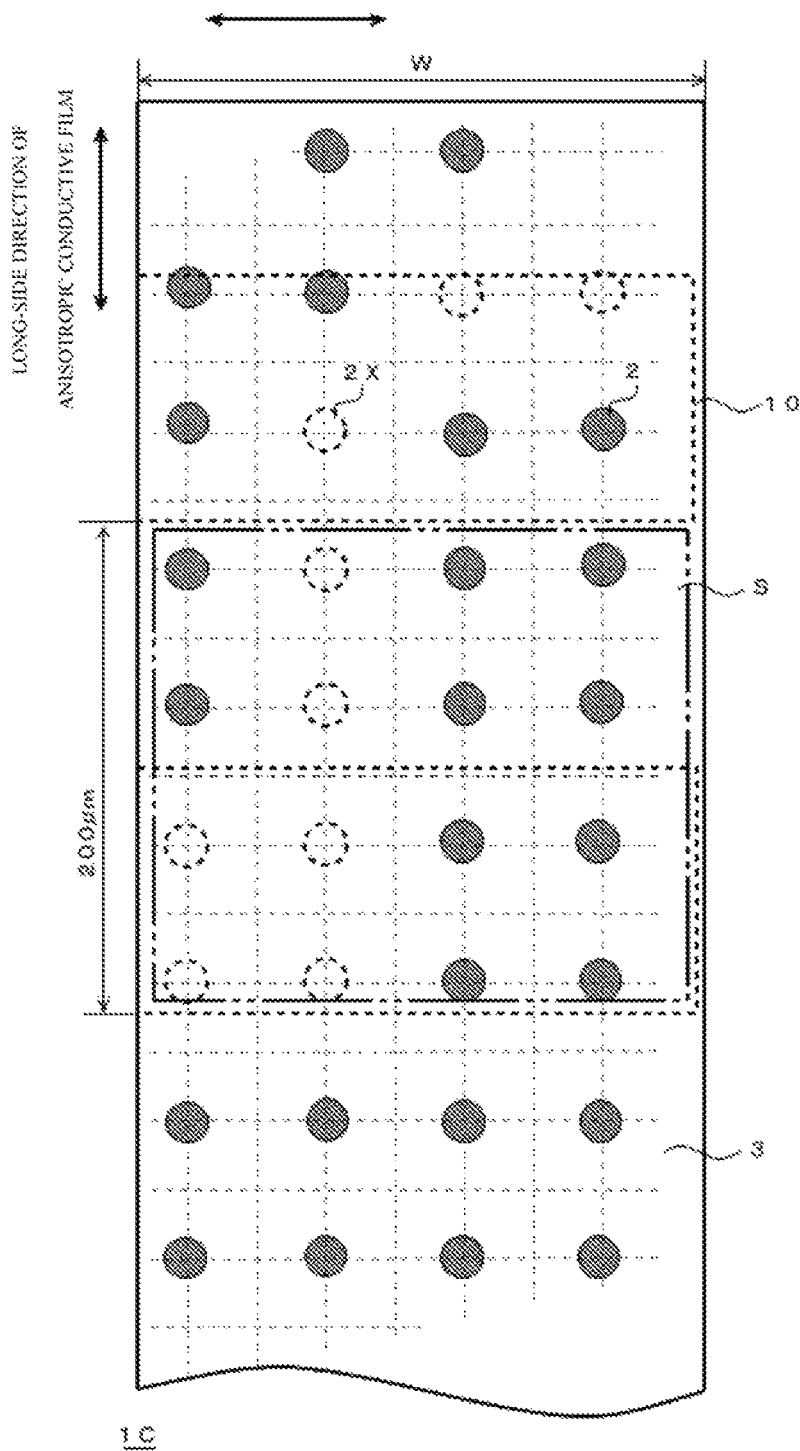

[FIG. 4]
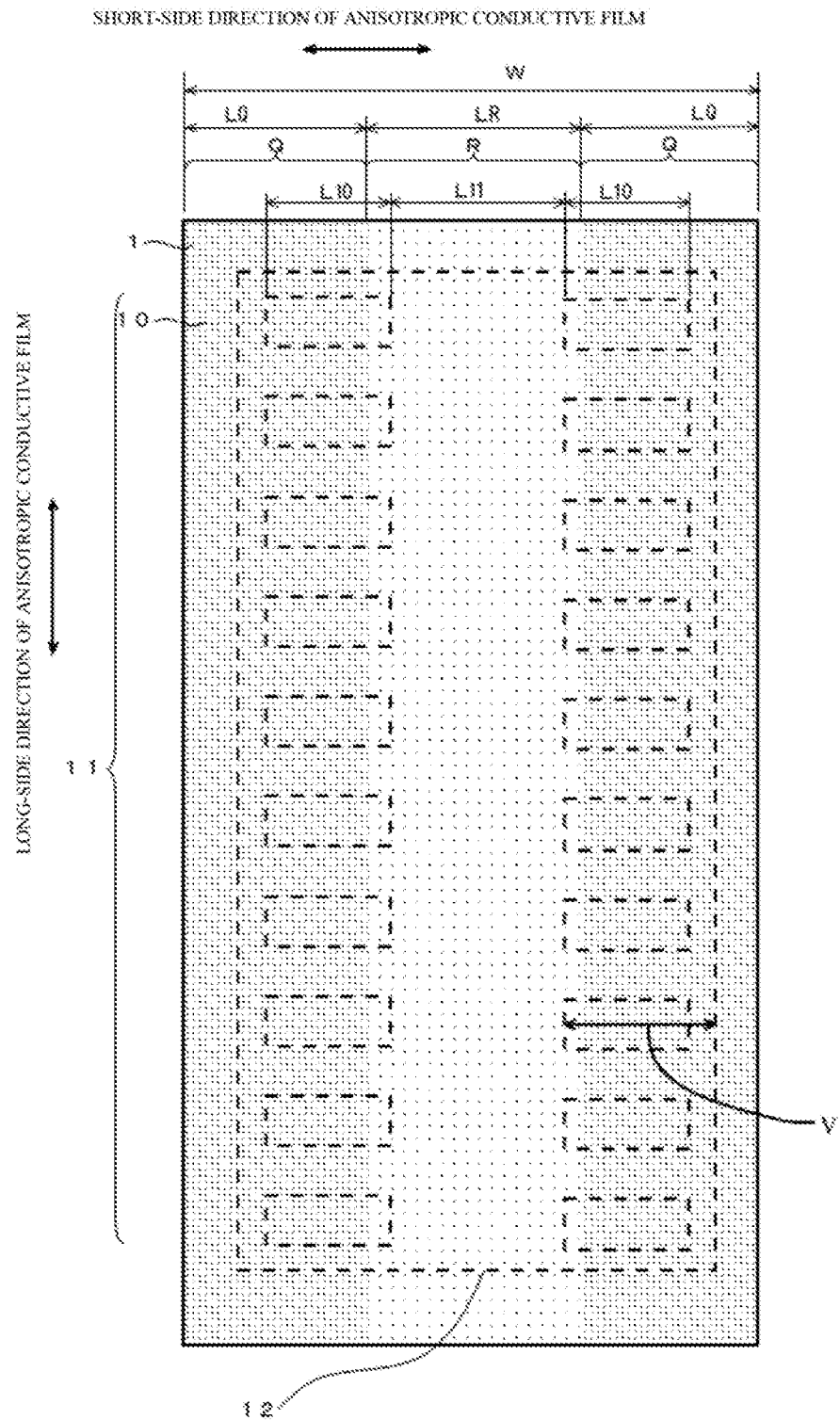

[FIG. 5]
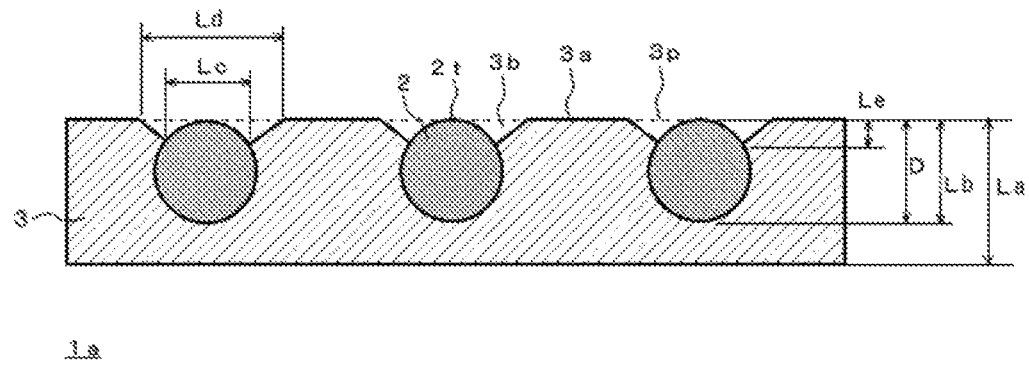
[FIG. 6]
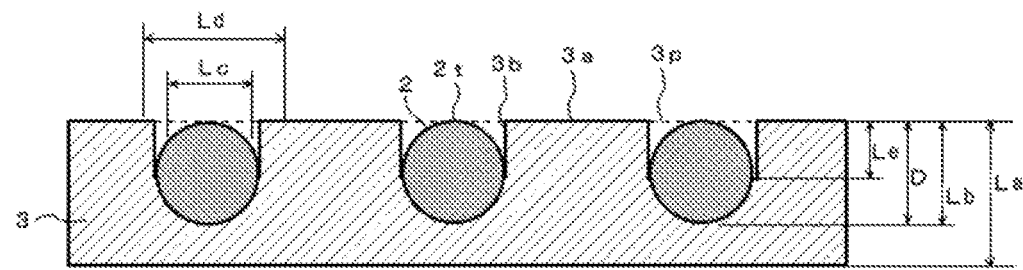
[FIG. 7]
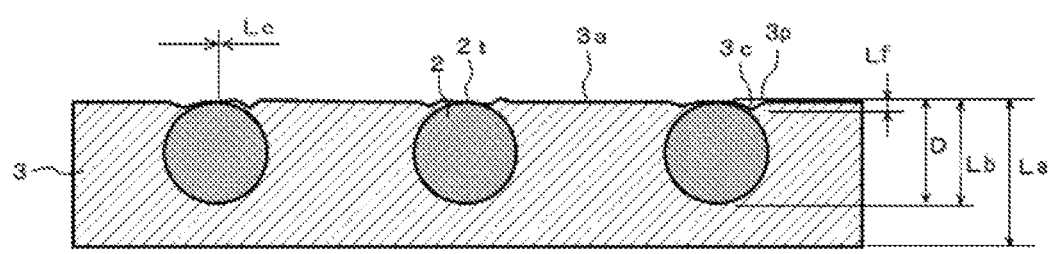

[FIG. 8]
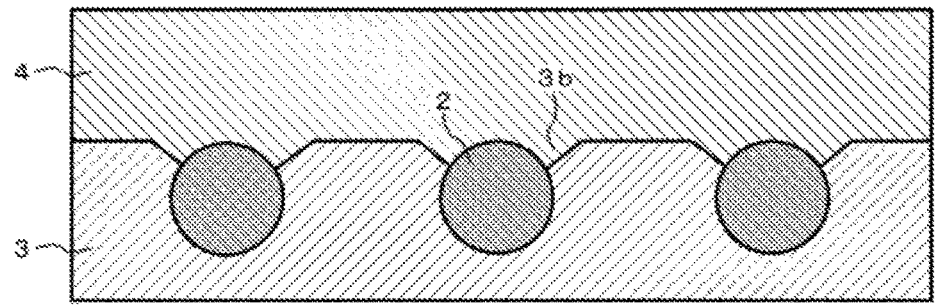
1d
[FIG. 9]
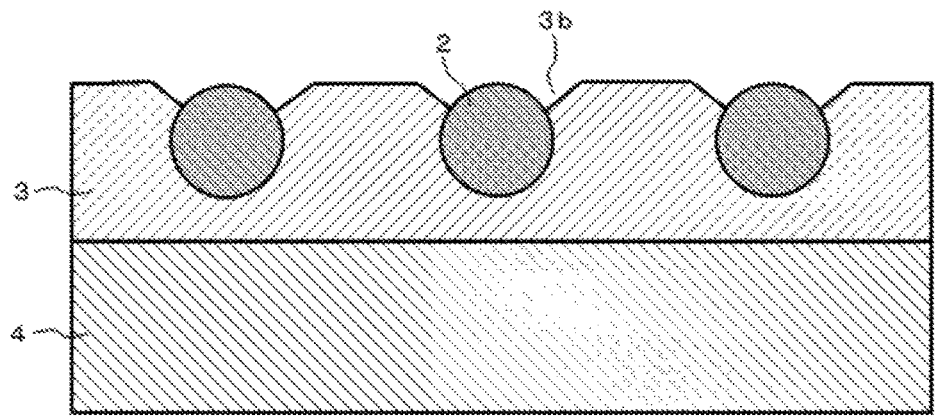
1e
[FIG. 10]
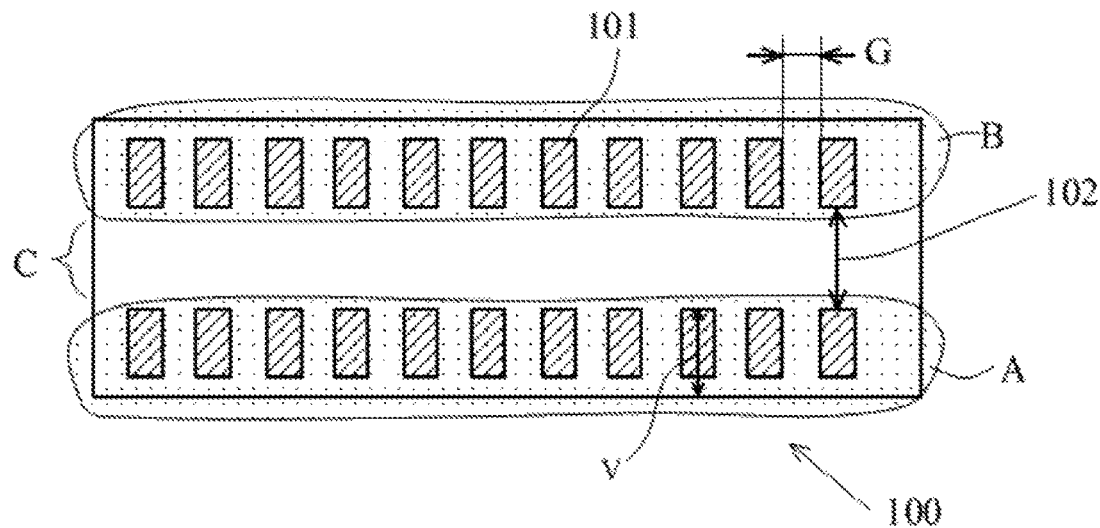

ANISOTROPIC CONDUCTIVE FILM

This Application is a Continuation of application Ser. No. 16/096,255 filed Oct. 24, 2018, which in turn is a National Stage Application of International Application No. PCT/JP2017/016245 filed on Apr. 24, 2017, which claims priority to Japanese Application No. 2017-084914 filed on Apr. 23, 2017 and Japanese Application No. 2016-092901 filed on May 5, 2016. The disclosures of the prior applications are hereby incorporated by reference in their entireties.

TECHNICAL FIELD

The present invention relates to an anisotropic conductive film.

BACKGROUND ART

Anisotropic conductive films in which conductive particles are dispersed in an insulating resin binder are widely used when mounting electronic components such as IC chips to substrates. There is a strong demand to increase the capacity of an anisotropic conductive film to capture conductive particles on bumps and to be able to avoid shorting by narrowing the pitch of bumps, which accompany the high-density mounting of electronic components of recent years.

To adapt anisotropic conductive films to this demand, various techniques for regularly disposing conductive particles in an array have been investigated. For example, a technique of disposing conductive particles with a single layer by laying conductive particles over a stretched film and biaxially stretching the film (Patent Document 1), a technique of holding conductive particles on a substrate using magnetism and transferring the conductive particles to an adhesive film to arrange the conductive particles in a prescribed array (Patent Document 2), and the like are known.

CITATION LIST

Patent Literature

Patent Document 1: JP 5147048 B
Patent Document 2: JP 4887700 B

SUMMARY OF INVENTION

Technical Problem

However, in a biaxial stretching method, it is difficult to arrange conductive particles at prescribed positions with precision, and omissions frequently occur in the arrangement of the conductive particles. With a transfer method, conductive particles can be disposed with higher precision than with a biaxial stretching method, but it is difficult to completely eliminate the omissions in conductive particles over the entire surface of the anisotropic conductive film.

In addition, since an anisotropic conductive film product is typically produced with long dimensions of 5 m or greater, it is difficult and unrealistic to produce a film with no omissions in conductive particles whatsoever over the entire length. For example, when a film with a omission in even one section is designated as a nonstandard defective product, the product yield decreases, and the production cost of the product increases. On the other hand, when omissions in conductive particles are widespread over a product, problems arise with the connection stability of anisotropic conductive connections.

Therefore, an object of the present invention is to enable anisotropic conductive connections on par with those of an anisotropic conductive film without omissions, even with an anisotropic conductive film in which omissions are present in a prescribed regular disposition of conductive particles.

Solution to Problem

The present inventors discovered that even in a case where there are omissions in a prescribed regular disposition of conductive particles, problems do not arise with anisotropic conductive connections in the following cases (A) to (C).

(A) When omissions are consecutive in a prescribed regular disposition of conductive particles, conduction failure tends to occur, and this tendency is particularly strong when omissions are consecutive in the long-side direction of an anisotropic conductive film. However, even in a case where there are consecutive omissions in the long-side direction of an anisotropic conductive film, conduction failure is unlikely to occur as long as the number of consecutive omissions is not greater than a prescribed number corresponding to the object of connection.

(B) When an anisotropic conductive film is used in film on glass (FOG) or the like in which the respective bump areas are relatively large, the bump width is typically at most around 200 μm. As long as there are ten or more conductive particles in a range of 200 μm in the long-side direction of the anisotropic conductive film, substantially no problems with connections arise even in a case where there are omissions in the regular disposition of the conductive particles.

(C) When an anisotropic conductive film is used in chip on glass (COG) in which bumps are positioned in specific sections (for example, there are rows of bumps at both ends in the short-side direction) and the respective bump areas are relatively small, as long as the sections including at least a prescribed number of consecutive omissions in conductive particles (that is, sections with large omissions of a level that would be problematic for practical use) are present along both ends in the short-side direction of the anisotropic conductive film when aligning both ends in the short-side direction of the anisotropic conductive film and the terminal arrays of the chips, problems are unlikely to arise with connections even if there are more than a prescribed number of consecutive omissions in conductive particles in the central portion in the short-side direction.

The present invention is conceived based on these findings and provides an anisotropic conductive film at least 5 m long having a regular disposition region in which conductive particles are disposed regularly in an insulating resin binder, wherein a standard region including no sections with more than a prescribed number of consecutive omissions in conductive particles is present in the regular disposition region over a prescribed width in a short-side direction of the anisotropic conductive film and at least a prescribed length in a long-side direction of the anisotropic conductive film.

The configuration of the anisotropic conductive film of an embodiment of the present invention is significant in that, even in a case where there are omissions in a prescribed regular disposition of conductive particles, anisotropic conductive connections on par with those of an anisotropic conductive film without omissions can be achieved; in other words, the amount of conductive particles that are present is reduced within a range that does not diminish the characteristics of the anisotropic conductive film. Accordingly, the anisotropic conductive film of an embodiment of the present invention enables a reduction in the amount of metal used for conductive particles, which not only yields an effect of cutting the production cost, but also contributes to an effect of reducing the environmental burden or to the mitigation of the specification conditions of an anisotropic conductive film product (enhancement of production yield). To achieve stable conduction properties with the smallest number of conductive particles required for anisotropic conductive connection in this way, the regular disposition region and the standard region preferably match. Note that as long as the effect of an embodiment of the present invention is not substantially diminished, there may also be nonstandard sections, which are sections including at least a prescribed number of consecutive omissions in conductive particles.

In particular, as an anisotropic conductive film in which the respective bump areas are relatively small and the number of bumps is large, for example, an anisotropic conductive film for chip on glass (COG), the present invention provides a mode having a standard region along at least an end region in the short-side direction of the anisotropic conductive film.

In addition, as an anisotropic conductive film in which the respective bump areas are relatively large, for example, an anisotropic conductive film for film on glass (FOG), the present invention provides a mode in which ten or more conductive particles are present in an discretionarily selected region of 200 μm in the long-side direction over the entire width of the anisotropic conductive film.

The present invention also provides a method for producing an anisotropic conductive film at least 5 m long, wherein a wide base material of an anisotropic conductive film in which conductive particles are disposed regularly in an insulating resin binder is cut in a length direction so that no nonstandard sections including at least a prescribed number of consecutive omissions in conductive particles are included in a regular disposition, or so that nonstandard sections are at intended positions in a short-side direction of the film.

The present invention also provides a method for producing an anisotropic conductive film at least 5 m long, wherein nonstandard sections including at least a prescribed number of consecutive omissions in conductive particles are removed from an anisotropic conductive film including a standard disposition region in which conductive particles are disposed regularly in an insulating resin binder, and the anisotropic conductive films after removal are connected. As long as the film is at least 5 m long, the film can be mounted on an anisotropic conductive connection apparatus for continuous production and can be inspected easily. That is, the burden of inspection can be reduced when substituted for an anisotropic conductive film used in a general-purpose anisotropic conductive connection structure.

The present invention further provides a method for producing a connection structure, the method including establishing an anisotropic conductive connection between terminal arrays of a first electronic component and a second electronic component by subjecting a first electronic component including a terminal array and a second electronic component including a terminal array to thermocompression bonding via an anisotropic conductive film including a standard disposition region in which conductive particles are disposed regularly in an insulating resin binder, wherein an anisotropic conductive film in which a standard region including no sections with more than a prescribed number of consecutive omissions in conductive particles is formed in the standard disposition region over a prescribed width in a short-side direction of the anisotropic conductive film and a prescribed length in a long-side direction of the anisotropic conductive film is used as an anisotropic conductive film; and the standard region is aligned with the terminal arrays of the electronic components.

In this method, when the first electronic component and the second electronic component respectively have a plurality of terminal arrays and the standard regions are formed in an array on the anisotropic conductive film, the regions between adjacent standard regions are preferably aligned with the regions between the respective terminal arrays.

Advantageous Effects of Invention

With the production method for an anisotropic conductive film according to the present invention, an anisotropic conductive film can be produced by extracting regions with no problems from a practical stand point from an anisotropic conductive film that has been assessed to be defective due to omissions in conductive particles. In addition, with the method for producing a connection structure according to the present invention, even in a case where the anisotropic conductive film used in the production of a connection structure includes sections assessed to be problematic from the perspective of omissions in conductive particles, when a region including no sections with more than a prescribed number of consecutive omissions in conductive particle is extended over a prescribed width in the short-side direction of the anisotropic conductive film and a prescribed length in the long-side direction of the anisotropic conductive film, the standard region is aligned with the terminal arrays of the electronic components. Accordingly, the production yield of the anisotropic conductive film can be enhanced without diminishing the reliability of anisotropic conductive connections.

BRIEF DESCRIPTION OF DRAWINGS

FIG. 1 is a plan view for explaining the disposition of conductive particles in an anisotropic conductive film 1A of examples.

FIG. 2 is a plan view for explaining the disposition of conductive particles in an anisotropic conductive film 1B of the examples.

FIG. 3 is a plan view for explaining the disposition of conductive particles in an anisotropic conductive film 1C of the examples.

FIG. 4 is a plan view illustrating the positions of sections with a nonstandard disposition of conductive particles in an anisotropic conductive film for COG.

FIG. 5 is a cross-sectional view of an anisotropic conductive film 1a of the examples.

FIG. 6 is a cross-sectional view of an anisotropic conductive film 1b of the examples.

FIG. 7 is a cross-sectional view of an anisotropic conductive film 1c of the examples.

FIG. 8 is a cross-sectional view of an anisotropic conductive film 1d of the examples.

FIG. 9 is a cross-sectional view of an anisotropic conductive film 1e of the examples.

FIG. 10 is a schematic diagram illustrating the bump arrangement of an IC for evaluation.

DESCRIPTION OF EMBODIMENTS

The present invention will be described in detail hereinafter with reference to the drawings. Note that in the drawings, the same reference characters are used to indicate components that are the same or equivalent.

Anisotropic Conductive Film

Overall Configuration of Anisotropic Conductive Film

The anisotropic conductive film of an embodiment of the present invention includes a region in which conductive particles are disposed regularly in an insulating resin binder (regular disposition region), and the conductive particles are preferably distanced from one another and disposed regularly (in a lattice form, for example) in a plan view. Here, one regular disposition region may extend over the entire surface of the anisotropic conductive film, or a plurality of groups of conductive particles may be respectively disposed at a distance from one another as regular disposition regions over the entire surface.

Since the anisotropic conductive film of an embodiment of the present invention has a regular disposition region, omissions in conductive particles in a regular disposition of conductive particles can be tested and understood accurately. The anisotropic conductive film of an embodiment of the present invention is one in which a standard region including no sections with more than a prescribed number of consecutive omissions in conductive particles is present in such a regular disposition region over a prescribed width in a short-side direction of the anisotropic conductive film and at least a prescribed length in a long-side direction of the anisotropic conductive film. Note that when a plurality of groups of conductive particles are respectively disposed at a distance from one another as regular disposition regions over the entire surface of an anisotropic conductive film, a standard region is present in each of the regular disposition regions over a prescribed width in the short-side direction of the anisotropic conductive film and at least a prescribed length in the long-side direction of the anisotropic conductive film.

Here, with regard to the standard region, the short-side direction of the anisotropic conductive film serves as the long-side direction of a terminal in a typical anisotropic conductive connection structure. Thus, the capacity to capture conductive particles extending in the short-side direction of the anisotropic conductive film with the terminal is enhanced, and the anisotropic conductive connection conditions can be mitigated relatively easily. Accordingly, when the anisotropic conductive film is completely pressed into a connection tool in the short-side direction to contribute to an anisotropic conductive connection, the pressing width conditions in the short-side direction of the anisotropic conductive film can also be mitigated. Specifically, the upper limit of the "prescribed width" in the short-side direction of the anisotropic conductive film is preferably not greater than 95% and more preferably not greater than 90% of the short-side direction of the anisotropic conductive film, and the lower limit is preferably not less than 10% and more preferably not less than 20% of the short-side direction of the anisotropic conductive film. In addition, the position of the "prescribed width" in the short-side direction of the anisotropic conductive film is preferably a position other than the central portion in the short-side direction of the anisotropic conductive film, that is, at the ends (both ends) so that the film can be easily applied to an anisotropic conductive connection of an IC chip such as a typical COG or an anisotropic conductive connection with a similar terminal layout. The widths of the respective standard regions at both ends may be the same as or different than one another. This is to accommodate the required terminal layout.

On the other hand, with regard to the standard region, "at least a prescribed length" in the long-side direction of the anisotropic conductive film (that is, the short-side direction of a terminal in a typical anisotropic conductive connection structure) may be not less than 5 mm, preferably not less than 10 mm, and more preferably not less than 20 mm (equivalent to 0.4% when the length of the anisotropic conductive film is 5 m) on the basis of an anisotropic conductive connection structure (for example, a small site mounting body with dimensions of 10 mm squared such as a camera module). In addition, in the case of a large anisotropic conductive connection structure (for example, a large display of 80 or more inches), the regular disposition region may be 2000 mm or greater.

Note that with regard to the standard region, the upper limit of "at least a prescribed length" in the long-side direction of the anisotropic conductive film is preferably longer in that the quality of the anisotropic conductive film itself is enhanced. Accordingly, although the upper limit of "at least a prescribed length" is not particularly limited, from the perspective of performing imaging examinations when managing the quality of the anisotropic conductive film, limiting the value to a certain length also facilitates quality-related information management. For example, by dividing the film at a certain length, comparisons of data for each section of that length can be performed easily. In addition, there is also the advantage that the volume of image data can simply be small. An example of the upper limit of "at least a prescribed length" is not greater than 1000 m, and when the upper limit is preferably not greater than 500 m, more preferably not greater than 350 m, and even more preferably not greater than 50 m, image data for tests can be processed or managed easily.

Note that it is preferable for the standard region to be equal and in alignment with the regular disposition region from the perspective of stable connections. Note that as long as the effect of the present invention is not substantially diminished, there may also be sections (nonstandard sections) including at least a prescribed number of consecutive omissions in conductive particles in the regular disposition region. Also note that a blank region in which no conductive particles are present or a random disposition region in which conductive particles are disposed at random may also be present outside the regular disposition region of the anisotropic conductive film.

In addition, to stabilize the productivity of a connection structure using an anisotropic conductive connection, the length of the anisotropic conductive film of an embodiment of the present invention is preferably not less than 5 m, more preferably not less than 10 m, and even more preferably not less than 50 m. On the other hand, when the film length is too large, the effort is required to set the film in the apparatus or to transport the film, or the cost of modifying the apparatus becomes large, and thus the length is preferably not greater than 5000 m, more preferably not greater than 1000 m, and even more preferably not greater than 500 m. In addition, the film width is not particularly limited but is, for example, from 0.5 to 5 mm.

Since the anisotropic conductive film has a large length relative to the width, the film is preferably a wound body which is wound around a reel. The wound body may be formed by connecting a plurality of anisotropic conductive films to one another. A connection tape may be used to connect the anisotropic conductive films. The thickness of the connection tape is not particularly limited, but when the tape is too thick, the tape may have an adverse effect on the protrusion or blocking of the resin. Thus, the thickness is preferably from 10 to 40 µm.

Disposition of Conductive Particles

An example of a regular disposition of conductive particles is a square lattice arrangement, as in the anisotropic conductive film 1A illustrated in FIG. 1. Other examples of a regular disposition of conductive particles include lattice arrangements such as a rectangular lattice, a rhombic lattice, or a hexagonal lattice. Rows of particles in which conductive particles are arranged linearly at a prescribed spacing may be arranged at a prescribed spacing. In addition, as in the anisotropic conductive film 1B illustrated in FIG. 2, conductive particles 2 may account for a plurality of the vertices of a regular polygon (in this example, a regular hexagon) when regular polygons are juxtaposed without spacing therebetween, and the disposition of the conductive particles may be conceptualized as trapezoidal repeating units 5 including conductive particles 2a, 2b, 2c, and 2d. Note that a trapezoidal repeating unit is one example of a regular disposition of conductive particles, and the units may be distanced from one another, or a collection of a plurality of repeating units may form isolated regular disposition regions of conductive particles. Here, the repeating units 5 are repeating units of the disposition of conductive particles formed by successively connecting the centers of the closest conductive particles 2, and the repeating units 5 extend all over the anisotropic conductive film by means of repetition with prescribed regularity. The disposition shape of the conductive particles in the repeating units 5 themselves is not particularly limited, but when the conductive particles 2 covers a portion of the regular polygon in a repeating unit 5, the disposition of the conductive particles is easy to understand. Thus, the presence or absence of omissions in conductive particles with respect to a prescribed disposition can be easily assessed. Note that when the disposition of the conductive particles is easily understood, the respective operations become easy at the time of production of an anisotropic conductive film or in product tests such as indentation tests after an electronic component is connected using the anisotropic conductive film, which makes it possible to reduce the operation time and to reduce the workload.

The lattice axis or arrangement axis of the arrangement of the conductive particles 2 may be parallel to the long-side direction of the anisotropic conductive film or may intersect with the long-side direction of the anisotropic conductive film and can be determined in accordance with the terminal width, terminal pitch, or the like of the terminal to be connected. For example, in the case of an anisotropic conductive film for a fine pitch, as illustrated in FIG. 1, the lattice axis L1 of the conductive particles 2 intersects obliquely with the long-side direction of the anisotropic conductive film 1A, and the angle θ formed by the long-side direction (short-side direction of the film) of a terminal 10 to be connected with the anisotropic conductive film 1A and the lattice axis L1 is from 6° to 84° and is preferably from 11° to 74°.

Conductive Particles

Any conductive particles used in a known anisotropic conductive film may be appropriately selected and used as the conductive particles 2. Examples of the conductive particles include metal particles such as nickel, copper, silver, gold, and palladium and metal-coated resin particles, where the surface of resin particles such as polyamide and polybenzoguanamine is coated with a metal such as nickel. The diameter of the disposed conductive particles is preferably not less than 1 µm and not greater than 30 µm, more preferably not less than 1 µm and not greater than 10 µm, and even more preferably not less than 2 µm and not greater than 6 µm.

The average particle diameter of the conductive particles 2 can be measured by using an image-type or laser-type particle size distribution meter. The anisotropic conductive film may be observed in a plan view to measure and determine the particle diameter. In this case, preferably at least 200 particles, more preferably at least 500 particles, and even more preferably at least 1000 particles are measured.

The surfaces of the conductive particles 2 are preferably coated by insulating coating, insulating particle treatment, or the like. A coating which is not easily peeled from the surfaces of the conductive particles 2 and does not cause problems with anisotropic conductive connection is selected as such a coating. In addition, protrusions may be formed on all or a portion of the surfaces of the conductive particles 2. The height of the protrusions is not greater than 20% and preferably not greater than 10% of the conductive particle diameter.

Shortest Distance Between Conductive Particles

The shortest distance between conductive particles is preferably not less than 0.5 times the average particle diameter of the conductive particles. When this distance is too small, shorting becomes more likely to occur due to contact between conductive particles. The upper limit of the distance between adjacent conductive particles can be determined in accordance with the bump shape or the bump pitch. As one example, when ten or more conductive particles are to be captured, the distance may be less than 50 times and is preferably less than 40 times the average particle diameter. The distance is more preferably less than 30 times the average particle diameter.

Number Density of Conductive Particles

From the perspective of suppressing the production cost of the anisotropic conductive film, the number density of the conductive particles is preferably not greater than 50000 particles/mm$^2$, more preferably not greater than 35000 particles/mm$^2$, and even more preferably not greater than 30000 particles/mm$^2$. On the other hand, since poor conduction due to the insufficient capture of conductive particles by the terminals is a concern when the number density of the conductive particles is too small, the number density may be not less than 30 particles/mm$^2$ and is preferably not less than 300 particles/mm$^2$, more preferably not less than 500 particles/mm$^2$, and even more preferably not less than 800 particles/mm$^2$.

Insulating Resin Binder

As the insulating resin binder 3, a thermo-polymerizable composition, a photopolymerizable composition, a polymerizable composition using both light and heat, or the like that is used as an insulating resin binder in a known anisotropic conductive film may be appropriately selected and used. Of these, examples of thermo-polymerizable compositions include thermal radical polymerizable resin compositions containing an acrylate compound and a thermal radical polymerization initiator, thermal cationic polymerizable resin compositions containing an epoxy compound and a thermal cationic polymerization initiator, and thermal anionic polymerizable resin compositions containing an epoxy compound and a thermal anionic polymerization initiator. Examples of photopolymerizable compositions include photoradical polymerizable resin compositions or the like containing an acrylate compound and a photoradical polymerization initiator. A plurality of types of polymerizable compositions may be used in combination as long as no particular problems arise. An example of combined use is the combined use of a thermal cationic polymerizable composition and a thermal radial polymerizable composition.

Here, a plurality of types of photopolymerization initiators which react with light of different wavelengths may be included. As a result, different wavelengths may be used for the photocuring of a resin forming the insulating resin layer at the time of the production of the anisotropic conductive film and the photocuring of a resin for bonding electronic components to one another at the time of anisotropic conductive connection.

When the insulating resin binder 3 is formed using a photopolymerizable composition, all or a portion of the photopolymerizable compound contained in the insulating resin binder 3 may be photocured by means of photocuring at the time of the production of the anisotropic conductive film. As a result of this photocuring, the disposition of the conductive particles 2 in the insulating resin binder 3 is maintained or stabilized, which yields prospects for the suppression of shorting and the enhancement of capturing. In addition, by adjusting the conditions of this photocuring, the viscosity of the insulating resin layer in the production process of the anisotropic conductive film can be adjusted.

The compounded amount of the photopolymerizable compound in the insulating resin binder 3 is preferably not greater than 30 mass %, more preferably not greater than 10 mass %, and even more preferably less than 2 mass %. This is because when the amount of the photopolymerizable compound is too large, the thrust required for pressing at the time of anisotropic conductive connection increases.

On the other hand, although the thermo-polymerizable composition contains a thermo-polymerizable compound and a thermal polymerization initiator, a compound which also functions as a photopolymerizable compound may also be used as this thermo-polymerizable compound. In addition, the thermo-polymerizable composition may also contain a photopolymerizable compound separately from the thermo-polymerizable compound as well as a photopolymerization initiator. The composition preferably contains a photopolymerizable compound and a photopolymerization initiator separately from the thermo-polymerizable compound. For example, a thermal cationic polymerization initiator may be used as a thermal polymerization initiator, an epoxy resin may be used as a thermo-polymerizable compound, a photoradical polymerization initiator may be used as a photopolymerization initiator, and an acrylate compound may be used as a photopolymerizable compound. The insulating binder 3 may also contain a cured product of these polymerizable compositions.

The acrylate compound used as a thermo or photopolymerizable compound may be a known thermally polymerizable (meth)acrylate monomer. Examples thereof include monofunctional (meth)acrylate-based monomers and polyfunctional, that is, two or more functional, (meth)acrylate-based monomers.

In addition, an epoxy compound used as a polymerizable compound forms a three-dimensional mesh structure to provide good heat resistance and adhesiveness, and a solid epoxy resin and a liquid epoxy resin are preferably used in combination. Here, a solid epoxy resin refers to an epoxy resin which is a solid at room temperature. In addition, a liquid epoxy resin refers to an epoxy resin which is a liquid at room temperature. Room temperature refers to the temperature range from 5 to 35° C. prescribed by JIS Z 8703. In an embodiment of the present invention, two or more types of epoxy compounds may be used in combination. An oxetane compound may be used in addition to the epoxy compound.

The solid epoxy resin is not particularly limited as long as it is compatible with the liquid epoxy resin and is a solid at room temperature, and examples thereof include bisphenol A epoxy resins, bisphenol F epoxy resins, polyfunctional epoxy resins, dicyclopentadiene epoxy resins, novolac phenol epoxy resins, biphenol epoxy resins, and naphthalene epoxy resins. One type of these may be used alone, or two or more types may be used in combination. Of these, it is preferable to use a bisphenol A epoxy resin.

The liquid epoxy resin is not particularly limited as long as it is a liquid at room temperature, and examples thereof include bisphenol A epoxy resins, bisphenol F epoxy resins, novolac phenol epoxy resins and naphthalene epoxy resins. One type of these may be used alone, or two or more types may be used in combination. In particular, it is preferable to use a bisphenol A epoxy resin from the perspective of tackiness of the film, flexibility or the like.

Of the thermal polymerization initiator, examples of thermal radical polymerization initiators may include organic peroxides and azo compounds. In particular, organic peroxides may be preferred because they do not produce nitrogen, which can induce bubbles.

The amount of the thermal radical polymerization initiator to be used preferably ranges from 2 to 60 parts by mass, and more preferably from 5 to 40 parts by mass, per 100 parts by mass of a (meth)acrylate compound. When the amount is too small, insufficient curing will occur. When the amount is too large, the product life will decrease.

The thermal cationic polymerization initiator may be a known thermal cationic polymerization initiator for epoxy compounds. Examples of the initiator include iodonium salts, sulfonium salts, phosphonium salts, and ferrocenes, which generate acid via heat. In particular, aromatic sulfonium salts, which exhibit good temperature latency, may be preferred.

The amount of the thermal cationic polymerization initiator to be used preferably ranges from 2 to 60 parts by mass, and more preferably from 5 to 40 parts by mass, per 100 parts by mass of an epoxy compound. When the amount is too small, insufficient curing tends to occur. When the amount is too large, the product life tends to decrease.

A publicly known curing agent that is ordinarily used can be used as the anionic polymerization initiator. Examples include organic acid dihydrazide, dicyandiamide, amine compounds, polyamide amine compounds, cyanate ester compounds, phenol resins, acid anhydride, carboxylic acid, tertiary amine compounds, imidazole, Lewis acid, Bronsted acid salts, polymercaptan-based curing agents, urea resins, melamine resins, isocyanate compounds, and block isocyanate compounds. One type of these may be used alone, or two or more types may be used in combination. Of these, it is preferable to use a microcapsule-type latent curing agent formed by using an imidazole-modified substance as a core and covering the surface thereof with polyurethane.

The thermo-polymerizable composition preferably contains a film forming resin. The film-forming resin corresponds to a high-molecular-weight resin having an average molecular weight of not less than 10000, for example, and an average molecular weight of from approximately 10000 to approximately 80000 is preferable from the perspective of film formability. Examples of film-forming resins include various resins such as phenoxy resins, polyester resins, polyurethane resins, polyester urethane resins, acrylic resins, polyimide resins, and butyral resins. These may be used alone, or two or more types may be used in combination. Of these, a phenoxy resin is may be suitably used from the standpoints of film formation state, connection reliability, and the like.

The thermo-polymerizable composition may also contain an insulating filler to adjust the melt viscosity. Examples of this include silica powders and alumina powders. The size of the insulating filler is preferably from 20 to 1000 nm, and the compounded amount is preferably from 5 to 50 parts by mass per 100 parts by mass of the thermo-polymerizable compound (photopolymerizable compound) such as an epoxy compound. Further, thermo-polymerizable composition may also contain fillers, softeners, promoters, antioxidants, colorants (pigments and dyes), organic solvents, ion scavengers, and the like which differ from the insulating filler described above.

In addition, stress relaxation agents, silane coupling agents, inorganic fillers, or the like may also be compounded as necessary. Examples of stress relaxation agents include hydrogenated styrene-butadiene block copolymers and hydrogenated styrene-isoprene block copolymers. Examples of silane coupling agents include epoxy-based, methacryloxy-based, amino-based, vinyl-based, mercapto-sulfoxide-based, and ureide-based silane coupling agents. Examples of inorganic fillers include silica, talc, titanium oxide, calcium carbonate, and magnesium oxide.

Note that the insulating resin binder 3 may be formed by depositing a coating composition containing the resin described above to form a layer by a coating method and drying or further curing, or otherwise by forming a film using a known technique in advance. The insulating resin binder 3 may be obtained by laminating a resin layer as necessary. In addition, the insulating resin binder 3 is preferably formed on a release film such as a polyethylene terephthalate film that has been release-treated.

Viscosity of Insulating Resin Binder

The minimum melt viscosity of the insulating resin binder 3 can be determined appropriately in accordance with the production method or the like of the anisotropic conductive film. For example, when a method of holding the conductive particles at a prescribed disposition on the surface of the insulating resin binder and pressing the conductive particles into the insulating resin binder is used as the production method of the anisotropic conductive film, the minimum melt viscosity of the insulating resin binder 3 is preferably not less than 1100 Pa·s from the perspective of film formability. In particular, from the perspective of enabling film formation at 40 to 80° C., the 60° viscosity of the insulating resin binder 3 is preferably from 3000 to 20000 Pa·s. In addition, as described below, from the perspective of forming concavities 3b around the exposed portions of the conductive particles 2 pressed into the insulating resin binder 3, as illustrated in FIG. 5 or 6, or from the perspective of forming concavities 3c directly above the conductive particles 2 pressed into the insulating resin binder 3, as illustrated in FIG. 7, the minimum melt viscosity of the insulating resin binder 3 may be not less than 1500 Pa·s and is preferably not less than 2000 Pa·s, more preferably from 3000 to 15000 Pa·s, and even more preferably from 3000 to 10000 Pa·s. The minimum melt viscosity may be determined in the following manner, for example. A rotary rheometer (available from TA Instruments) is used, a rate of temperature increase of 10° C./min and a measurement pressure of 5 g are maintained to be constant, and a measurement plate of 8 mm in diameter is used. In addition, when performing the step of pressing the conductive particles 2 into the insulating resin binder 3 at 40 to 80° C., the viscosity of the insulating resin binder 3 at 60° C. is preferably from 3000 to 20000 Pa·s from the perspective of the formation of the concavity 3b or 3c, as described above. This measurement is made with the same measurement method as in the case of the minimum melt viscosity, and the viscosity can be determined by extracting the value at a temperature of 60° C.

By setting the viscosity of the resin forming the insulating resin binder 3 to a high viscosity as described above, the conductive particles 2 inside the anisotropic conductive film can be prevented from being carried away by the flow of the melted insulating resin binder 3 when the conductive particles 2 are interposed between objects to be connected such as opposing electronic components and pressurized while heating at the time of the use of the anisotropic conductive film. In addition, when the amount of resin around or directly above the conductive particles is substantially zero or is reduced in comparison to the surrounding area thereof, as in the case of the concavity 3b or 3c, the pressing force applied to the conductive particles from the connecting tool is easily transmitted. Thus, the conductive particles can be interposed effectively between the terminals, and an improvement in conduction properties or an improvement in the capacity to capture conductive particles can be anticipated.

Thickness of Insulating Resin Binder

The thickness La of the insulating resin binder 3 is preferably not less than 1 μm and not greater than 60 μm, more preferably not less than 1 μm and not greater than 30 μm, and even more preferably not less than 2 μm and not greater than 15 μm. In addition, the thickness La of the insulating resin binder 3 is preferably such that the ratio (La/D) is from 0.6 to 10 in the relationship between the thickness La and the average particle diameter D of the conductive particles 2. When the thickness La of the insulating resin binder 3 is too large, the conductive particles tend to be displaced at the time of anisotropic conductive connection, and the capacity to capture conductive particles at the terminals is diminished. This trend is marked when La/D exceeds 10. Therefore, La/D is more preferably not greater than 8 and even more preferably not greater than 6. Conversely, when the thickness La of the insulating resin binder 3 is too small and La/D is less than 0.6, it becomes difficult to keep the conductive particles in a prescribed particle dispersion state or a prescribed arrangement with the insulating resin binder 3. In particular, when the terminal to be connected is a high-density COG, the ratio (La/D) of the layer thickness La of the insulating resin binder 3 to the particle diameter D of the conductive particles 2 is preferably from 0.8 to 2.

Mode in which Conductive Particles are Embedded in the Insulating Resin Binder

The embedded state of conductive particles 2 in the insulating resin binder 3 is not particularly limited, but when anisotropic conductive connection is performed by sandwiching the anisotropic conductive film between opposing parts and applying pressure while heating, the conductive particles 2 are partially exposed from the insulating resin binder 3 to form concavities 3b around the exposed portions of the conductive particles 2 with respect to the tangential plane 3p of the surface 3a of the insulating resin binder in the central portion between adjacent conductive particles 2, as illustrated in FIGS. 5 and 6, or concavities 3c are formed in the insulating resin binder portion directly above the conductive particles 2 pressed into the insulating resin binder 3 with respect to the same tangential plane 3p as that described above, and waves are preferably present in the surface of the insulating resin binder 3 directly above the conductive particles 2, as illustrated in FIG. 7. With respect to the flattening of the conductive particles 2 which occurs when the conductive particles 2 are interposed between the electrodes of opposing electronic components and are pressurized while heating, the presence of the concavities 3b illustrated in FIG. 5 leads to a reduction in the resistance applied to the conductive particles 2 from the insulating resin binder 3 in comparison to cases in which no concavities 3b are present. Therefore, the conductive particles 2 are more easily interposed between the opposing electrodes, and the conduction performance also improves. In addition, of the resins constituting the insulating resin binder 3, when concavities 3c (FIG. 7) are formed in the surface of the resin directly above the conductive particles 2, the pressure at the time of pressurization under heat is more easily concentrated on the conductive particles 2 than when no concavities 3c are present, and the conductive particles 2 are more easily interposed between the electrodes, which enhances the conduction performance.

From the perspective of more easily achieving the effect of the concavities 3b and 3c described above, the ratio (Le/D) of the maximum depth Le of the concavities 3b (FIGS. 5 and 6) around the exposed portions of the conductive particles 2 to the average particle diameter D of the conductive particles 2 is preferably less than 50%, more preferably less than 30%, and even more preferably from 20 to 25%. The ratio (Ld/D) of the maximum diameter Ld of the concavities 3b (FIGS. 5 and 6) around the exposed portions of the conductive particles 2 to the average particle diameter D of the conductive particles 2 is preferably not greater than 150% and more preferably from 100 to 130%. The ratio (Lf/D) of the maximum depth Lf of the concavities 3c (FIG. 7) in the resin directly above the conductive particles 2 to the average particle diameter D of the conductive particles 2 is greater than 0, preferably less than 10%, and more preferably not greater than 5%.

The diameter Lc of the exposed portion of the conductive particles 2 may be not greater than the average particle diameter D of the conductive particles 2, and conductive particles 2 may be exposed at one point at the apical part 2t of the conductive particle 2, or the conductive particles 2 may be completely embedded in the insulating resin binder 3 so that the diameter Lc is zero. From the perspective of the ease of adjusting the positions of the conductive particles when the conductive particles are embedded in the insulating resin layer by pressing the conductive particles into the insulating resin layer, the diameter Lc is preferably not greater than 15%.

Positions of Conductive Particles in Thickness Direction of Insulating Resin Binder From the perspective of more easily achieving the effect of the concavities 3b described above, the ratio (Lb/D) (called the "embedding rate" hereafter) of the distance of the deepest part of the conductive particles 2 from the tangential plane 3p (called the "embedded amount" hereafter) to the average particle diameter D of the conductive particles 2 is preferably not less than 60% and not greater than 105%.

Insulating Adhesive Layer

In the anisotropic conductive film of an embodiment of the present invention, an insulating adhesive layer 4 may be laminated on the insulating resin binder 3 in which the conductive particles 2 are disposed.

When the concavities 3b described above are formed in the insulating resin binder 3, the insulating adhesive layer 4 may be laminated on the surface where the concavities 3b are formed in the insulating resin binder 3, as in the anisotropic conductive film 1d illustrated in FIG. 8, or may be laminated on the surface on the opposite side as the surface where the concavities 3b are formed, as in the anisotropic conductive film 1e illustrated in FIG. 9. This is also the same for cases in which the concavities 3c are formed in the insulating resin binder 3. As a result of the lamination of the insulating adhesive layer 4, the spaces formed by the electrodes or bumps of the electronic component can be filled when the electronic component is anisotropically conductively connected using the anisotropic conductive film, which makes it possible to enhance the adhesiveness.

Note that when the insulating adhesive layer 4 is laminated on the insulating resin binder 3, the insulating adhesive layer 4 is preferably on the side of an electronic component such as an IC chip which is pressed with a tool (in other words, the insulating resin binder 3 is on the side of an electronic component such as a substrate mounted on a stage), regardless of whether the insulating adhesive layer 4 is located on the surface where the concavities 3b and 3c are formed. As a result, the unintended movement of the conductive particles can be avoided, and the capturing performance can be enhanced.

The insulating adhesive layer 4 may be the same as a layer used as an insulating adhesive layer in a known anisotropic conductive film, and the viscosity may be adjusted to a lower level using the same resin as that of the insulating resin binder 3 described above. A greater difference between the minimum melt viscosities of the insulating adhesive layer 4 and the insulating resin binder 3 makes it easier for the space formed by the electrodes or bumps of the electronic component to be filled with the insulating adhesive layer 4, which makes it possible to anticipate an effect of enhancing the adhesiveness between electronic components. In addition, when this difference is greater, the amount of movement of the resin forming the insulating resin binder 3 becomes relatively small at the time of anisotropic conductive connection, and thereby the capacity to capture conductive particles at the terminals is more easily enhanced. From a practical standpoint, the minimum melt viscosity ratio of the insulating adhesive layer 4 and the insulating resin binder 3 is preferably not less than 2, more preferably not less than 5, and even more preferably not less than 8. On the other hand, when this ratio is too large, the protrusion or blocking of the resin may occur when a long anisotropic conductive film is formed into a wound body, and therefore the ratio is preferably not greater than 15 from a practical standpoint. More specifically, the preferable minimum melt viscosity of the insulating adhesive layer 4 satisfies the ratio described above and is not greater than 3000 Pa·s, more preferably not greater than 2000 Pa·s, and particularly preferably from 100 to 2000 Pa·s.

As a method of forming the insulating adhesive layer 4, the layer may be formed by depositing a coating composition containing the same resin as the resin used to form the insulating resin binder 3 with a coating method and drying or further curing, or by forming a film with a known technique in advance.

The thickness of the insulating adhesive layer 4 is not particularly limited but is preferably from 4 to 20 μm. Alternatively, the thickness may be from 1 to 8 times the conductive particle diameter.

In addition, the minimum melt viscosity of the entire laminated anisotropic conductive film combining the insulating resin binder 3 and the insulating adhesive layer 4 depends also on the ratio of the thickness of the insulating resin binder 3 to the thickness of the insulating adhesive layer 4, but the minimum melt viscosity may be not greater than 8000 Pa·s from a practical standpoint, and to facilitate the filling of the spaces between bumps, the minimum melt viscosity may be from 200 to 7000 Pa·s and is preferably from 200 to 4000 Pa·s.

Third Insulating Resin Layer

A third insulating resin layer may be provided on the opposite side so as to sandwich the insulating adhesive layer 4 and the insulating resin binder 3. For example, the third insulating resin layer may be made to function as a tack layer. As in the case of the insulating adhesive layer 4, the third insulating resin layer may also be provided to fill the spaces formed by the electrodes or bumps of the electronic component.

The resin composition, viscosity, and thickness of the third insulating resin layer may be the same as or different than those of the insulating adhesive layer 4. The minimum melt viscosity of the anisotropic conductive film combining the insulating resin binder 3, the insulating adhesive layer 4, and the third insulating resin layer is not particularly limited but may be not greater than 8000 Pa·s, from 200 to 7000 Pa·s, or from 200 to 4000 Pa·s.

Further, an insulating filler such as silica fine particles, alumina, and aluminum hydroxide may be added not only to the insulating resin binder 3, but also to the insulating adhesive layer 4 as necessary. The compounded amount of the insulating filler is preferably not less than 3 parts by mass and not greater than 40 parts by mass per 100 parts by mass of resin included in the layers. Thereby, even when the anisotropic conductive film is melted during anisotropic conductive connection, it is possible to prevent the conductive particles from moving unnecessarily due to the melted resin.

Method for Producing Anisotropic Conductive Film

Summary of Production Method

In an embodiment of the present invention, a wide base material of an anisotropic conductive film in which conductive particles are disposed regularly in an insulating binder is first acquired or manufactured, and omissions in the regular disposition of the conductive particles in the base material of the anisotropic conductive film are then investigated. To ensure that nonstandard sections including more than a prescribed number of consecutive omissions in conductive particles with respect to the regular disposition are not used as regions responsible for connections, the wide base material is cut into an anisotropic conductive film of a prescribed width to remove regions including nonstandard sections (first aspect). Alternatively, a wide base material is cut in the length direction with a prescribed width so that nonstandard sections are at intended positions in the short-side direction of the film (second aspect). In addition, an anisotropic conductive film at least 5 m long may be produced by connecting the anisotropic conductive films after the nonstandard sections are removed in the first aspect (that is, the remaining anisotropic conductive film or separate anisotropic conductive films after the nonstandard sections are removed).

Here, the method for producing the initial anisotropic conductive film prior to removing the regions described above is not particularly limited. For example, the method may entail producing an anisotropic conductive film is a method of producing a transfer mold for disposing conductive particles in a prescribed arrangement, filling the concave portions of the transfer mold with conductive particles, covering the transfer mold with an insulating resin binder 3 formed on a release film and applying pressure, and pressing the conductive particles into the insulating resin binder 3 to transfer the conductive particles to the insulating resin binder 3. Alternatively, an insulating adhesive layer 4 may be further laminated on the conductive particles 2. Thus, the anisotropic conductive film can be obtained.

In addition, an anisotropic conductive film may be produced by filling the concave portions of a transfer mold with conductive particles, covering the transfer mold with an insulating resin binder, transferring the conductive particles to the surface of the insulating resin binder from the transfer mold, and pressing the conductive particles on the insulating resin binder into the insulating resin binder. The amount of conductive particles that are embedded (Lb) can be adjusted by the pressing force, the temperature, or the like at the time of pressing. In addition, the shape and depth of the concavities 3b and 3c can be adjusted by the viscosity of the insulating resin binder, the pressing rate, the temperature, and the like at the time of pressing. For example, when producing an anisotropic conductive film 1a including the concavity 3b illustrated in FIG. 5 or producing an anisotropic conductive film 1c including the concavity 3c illustrated in FIG. 7 on the surface of an insulating resin binder, in accordance with the shape or depth of the concavity, the lower limit of the viscosity of the insulating resin binder at 60° C. is preferably not less than 3000 Pa·s, more preferably not less than 4000 Pa·s, and even more preferably not less than 4500 Pa·s, and the upper limit is preferably not greater than 20000 Pa·s, more preferably not greater than 15000 Pa·s, and even more preferably not greater than 10000 Pa·s. In addition, the temperature at the time of such pressing is from 40 to 80° C. and more preferably from 50 to 60° C.

Note that the transfer mold that is used may be, in addition to a mold in which the concave portions are filled with conductive particles, a mold in which a slightly adhesive agent is applied to the upper surfaces of convex portions so that the conductive particles adhere to the upper surfaces.

These transfer molds may be produced by using a known technique such as photolithography or printing.

In addition, the method used to dispose the conductive particles in a prescribed arrangement may be a method using a biaxially stretched film instead of a method using a transfer mold.

Handling Omission Regions

In the first mode of the method for producing an anisotropic conductive film according to an embodiment of the present invention, in either an anisotropic conductive film used for a connection structure in which the respective bump areas are relatively small (for example, a structure such as COG in which the terminal arrays to be connected are spaced apart from one another) or an anisotropic conductive film used for a connection structure in which the respective bump areas are relatively large (for example, a structure such as FOG in which the long side of the effective area to be connected is the same as the film width, and the terminal arrays are not spaced apart from one another), nonstandard sections including a prescribed number of consecutive sections with omissions in conductive particles are removed from the region in which conductive particles are disposed regularly (regular disposition region) in a film in which conductive particles are disposed regularly in a plan view, preferably a film in which conductive particles are distanced from one another and disposed regularly in a plan view. In other words, regions in which the sections of omissions are merely interspersed to a degree that does not cause problems with conduction stability after connection are not subject to removal. This degree that does not cause problems differs depending on the object of connection, but when an anisotropic conductive film is used for FOG, for example, problems are unlikely to arise in the conduction stability even in a case where there are from 1 to 20 or, in some cases, from 1 to 209 consecutive omissions in conductive particles. Here, the number 209, which is the number of consecutive omissions in conductive particles, has the meaning described next. Specifically, when attempting to dispose conductive particles in a 15×15 square lattice under the anisotropic conductive connection conditions (connection area: 0.4 µm²) of a FOG, in which the connection area is typically large with an anisotropic conductive film width of 2 mm and a connected terminal width of 200 µm, there are ideally 225 conductive particles present in a connection area of 0.4 µm², but this means that even in a case where 209 conductive particles are missing, 16 conductive particles would be present in the terminal inner region as the minimum number of particles captured in a connection area of 0.4 µm². Here, the number 16, which is the number of conductive particles that are captured, is set as a value between 11 and 20 particles, which is the lower limit of the preferable numerical value of particles to be captured and will be described below. This is therefore considered to be a numerical value suitable for finding conditions under which the conduction stability can be easily secured. In this way, when the number of conductive particles that are captured is greater (in this case, 16 particles) than the number of conductive particles on the lattice arrangement axis (as described above, the number of conductive particles on the lattice arrangement axis in this case is 15 particles), the number of conductive particles that are captured at one terminal is greater than the total number on the lattice axis in a given direction, so the conductive particles that are captured are present on at least two arrangement axes in the same direction. Thus, when the conductive particles disposed on at least two lattice axes are captured, it can be anticipated that the positions of the conductive particles captured at the terminal will be distanced from one another to a certain degree, and thus the pressure balance can be compared. That is, the conditions for assessing the quality of the pressing of the conductive particles at the time of connection are established. Note that when used for a COG, problems are unlikely to arise in conduction stability in a case where the number of consecutive omissions is from 1 to 20 particles, and problems are even more unlikely to arise if the number is not greater than 15 particles and, in particular, not greater than 10 particles.

Note that with regard to omissions in the standard region, even the standard region may include omissions which are permissible to a degree that does not inhibit connection, and the size of such permissible omissions can be assessed based on the spaces between terminals. A technique other than the aforementioned technique of assessing based on the number of consecutive omissions may be used. For example, the size of omissions in the long-side direction of the film (width direction of the terminals) are preferably not greater than the total space between the terminals (that is, a omission does not straddle two terminals), and omissions are preferably spaced in the short-side direction of the film (long-side direction of the terminals) by a distance greater than 50% of the terminal length. As a result, conductive particles that can be captured are present at least in regions with less than 50% of the terminal length. When the omissions are as described above, it can be anticipated that the conduction performance will be acceptable for typical anisotropic conductive connection. Note that when assuming such omissions, the size of the omissions may be determined by considering a rectangle formed by the longest distance between conductive particles in directions parallel to each of the long-side direction of the film and the short-side direction of the film.

When considered in this way, the size of permissible omissions when applied to a fine-pitch terminal such as a COG is, for example, preferably not greater than 80 µm, more preferably not greater than 30 µm, and even more preferably not greater than 10 µm in the long-side direction of the film (width direction of the terminal). In addition, in the short-side direction of the film (long-side direction of the terminal), it is preferable for a region in which at least 50% of conductive particles are captured to remain along the terminal length. The size is preferably not greater than 100 µm, more preferably not greater than 50 µm, and even more preferably not greater than 40 µm. Further, in the case of a FOG with a large terminal width, the size is preferably not greater than 400 µm and more preferably not greater than 200 µm in the long-side direction of the film (terminal width direction). Since the short-side direction of the film serves as the effective connection area, the size is not greater than 50% and preferably not greater than 30% of the short-side direction of the film. Depending on the terminal layout, the numerical values described above may be combined appropriately. This is because the present invention is not limited to a typical COG or FOG.

As illustrated in FIG. 1, cases in which sections 2X with omissions are present independently without being continuous, or less than a prescribed number of sections 2X with omissions are connected, are also included in an interspersed manner. In contrast, when there is a portion 2Y including at least a prescribed number of consecutive sections 2X with omissions, and this is removed as a nonstandard section, the anisotropic conductive film is cut in the long-side direction so as to remove a strip-like region R including this portion 2Y. Note that in FIG. 1, a region where three consecutive omissions are present is used as a nonstandard section, but this number of omissions is only an example.

The presence or absence of such omissions can be observed using an imaging apparatus such as an optical microscope, a metallurgical microscope, or a CCD camera. In addition, the presence or absence of omissions can be discovered by testing the dispersion state of conductive particles in the anisotropic conductive film 1A using an imaging apparatus and an image analysis processing system (for example, WinROOF, Mitani Corporation) in combination, and the positions thereof can be specified. Note that as an example of an imaging apparatus, an apparatus with a maximum pixel output (H)×(V) of 648×494 and a frame rate of from 30 to 60 fps can be applied.

In an anisotropic conductive film for a connection structure in which the respective bump areas are relatively large (FOG or the like), as illustrated in FIG. 3, a base material is preferably cut so that at least ten conductive particles are present in a given region S over a total width W of an anisotropic conductive film 1C and a length of 200 µm in the long-side direction of the anisotropic conductive film, in other words, so that at least ten electrically conductive particles are present in a range 200 µm long at a given position over the entire length of the anisotropic conductive film. This is because in a typical FOG connection, the bump width is at most around 200 µm. Note that since the bump length in a typical FOG connection (or tool width in the connection) is from 0.3 to 4 mm, the total width W after the cutting of the anisotropic conductive film in this case is preferably not greater than 4 mm.

From the perspective of increasing the number of conductive particles that are captured on a terminal to enhance the connection reliability, the number of conductive particles present in the region S is more preferably not fewer than 11 and even more preferably not fewer than 20 particles. The upper limit is not particularly limited. However, when the number of conductive particles captured on a terminal at the time of anisotropic conductive connection is too large due to an excessively large number of conductive particles present in the region S, the thrust required for the pressing jig used in the anisotropic conductive connection also increases excessively. In this case, there is a concern that the degree of pressing may differ excessively between the respective anisotropic conductive connection structures obtained by successive anisotropic conductive connection. Therefore, the number of conductive particles present in the region S is preferably not greater than 50, more preferably not greater than 40, and even more preferably not greater than 35 particles.

On the other hand, in the second aspect of the method for producing an anisotropic conductive film according to an embodiment of the present invention, in an anisotropic conductive film for a connection structure in which the respective bump areas are relatively small (such as a COG), a base material may be cut so that no nonstandard sections including more than a prescribed number of consecutive sections $2x$ with omissions in conductive particles with respect to a regular disposition are present at an end 1P in the short-side direction of the anisotropic conductive film 1A, thus ensuring that even in a case where there are omissions in conductive particles at the end 1P of the anisotropic conductive film after cutting, no nonstandard sections are present, and preferably that the conductive particles 2 are present in the prescribed disposition.

Here, the end 1P of the width in the short-side direction of the anisotropic conductive film 1A is preferably not greater than 20% and more preferably not greater than 30% of the width in the short-side direction of the anisotropic conductive film 1A. This is because in a connection of an electronic component using an anisotropic conductive film, a terminal array of the electronic component is ordinarily present in a strip-like region not greater than 20% of the width and more reliably a strip-like region not greater than 30% of the width in the short-side direction from an edge extending in the long-side direction of the anisotropic conductive film. Note that the size of the end 1P may differ for the left and right ends in accordance with the layout of the terminals of the electronic components to be connected.

In addition, as illustrated in FIG. 4, when bumps (terminals) 10 are arranged in two rows in an electronic component 12 such as an IC chip to be subjected to a COG connection, even in a case where nonstandard sections including at least a prescribed number of consecutive omissions in conductive particles are present in a region in which conductive particles are disposed regularly (regular disposition region), when standard regions Q in which no nonstandard sections are present are formed with a prescribed width in the short-side direction of the anisotropic conductive film 1 and a prescribed length in the long-side direction of the anisotropic conductive film 1, the standard regions Q are aligned with the terminal array 11. In other words, a region R including nonstandard sections, which is included in the anisotropic conductive film 1, is aligned with the region between two rows of terminals 11 (that is, a region in which no terminals to be connected are present), and opposing electronic components 12 are anisotropically conductively connected with the anisotropic conductive film 1. The present invention also includes a connection structure anisotropically conductively connected by such alignment. Note that in FIG. 4, the distance illustrated is the distance from the end of the electronic component 12 to the inner end of the bump 10. This distance preferably overlaps with the width of the standard regions Q. As an alignment method, when attaching a film to glass in the case of a COG, alignment may be achieved by moving a stage on which the glass is mounted or by moving the film side. This alignment method is not limited to the case of a COG and can also be applied to the production of a FOG or another connection structure. The present invention includes a method for producing a connection structure including such a step.

More specifically, the length L10 in the long-side direction of each terminal 10 is typically from 30 to 300 μm, and the range of the length L11 between two rows of terminals 11 is from 100 to 200 μm for a small electronic component such as an IC chip with a plurality of rows of bumps (for example, a three-row staggered arrangement) and a relatively small short end of the external shape, or from 1000 to 2000 μm for a large electronic component such as an IC chip with a relatively long short end of the external shape. Accordingly, in the anisotropic conductive film 1, no problems will arise in a COG connection as long as the width LR of the region R including nonstandard sections is not greater than the width of the length L11 between adjacent terminal arrays 11 and the width LQ of the standard region Q has the length L10 in the long-side direction of the terminal 10, and even in a case where the width LR of the region R of the anisotropic conductive film exceeds the length L11 between terminal arrays and the region R partially overlaps with the terminal arrays 11, no problems will arise from the perspective of practical use as long as the number of conductive particles captured by each terminal 10 as a result of anisotropic conductive connection is preferably not fewer than 10 and more preferably not fewer than 13 particles. For example, when the size of the terminal 10 is 100 μm×20 μm, the spacing L11 between terminal arrays 11 is 1000 μm, and the number density of conductive particles in the standard region Q of the anisotropic conductive film 1 is 32000 particles/mm$^2$, even in a case where the region R of the anisotropic conductive film overlaps with the terminal 10, a COG connection can be established without any problems from the perspective of practical use as long as the overlapping width is not greater than 50% of the length L10 of the terminal 10.

Cutting of the Anisotropic Conductive Film

In the method for producing an anisotropic conductive film according to an embodiment of the present invention, in order to increase the productivity of the anisotropic conductive film, an anisotropic conductive film in which omissions are essentially unproblematic is produced by preparing a long body of an anisotropic conductive film with a width of a certain magnitude, confirming omissions in conductive particles with the test method described above, preferably also confirming defective sites such as sites of aggregation, and cutting the film so that these sites are not included in the anisotropic conductive film of a prescribed width, or cutting the film into an anisotropic conductive film of a prescribed width so that sections with omissions or defective sites such as sites of aggregation are included in the anisotropic conductive film but are at intended positions in the short-side direction of the anisotropic conductive film. In the production process of this anisotropic conductive film, the defective sections may be marked to record the defective sections.

Connection of Anisotropic Conductive Films

In the method for producing an anisotropic conductive film according to an embodiment of the present invention, an anisotropic conductive film in which even in a case where omissions are included, the omissions are substantially unproblematic can also be provided by connecting the remaining anisotropic conductive films after the regions containing prescribed omission portions have been cut out.

With an embodiment of the present invention, an anisotropic conductive film including not more than a prescribed number of consecutive omissions in the long-side direction can be obtained inexpensively over the entire length of a long anisotropic conductive film with a length of not less than 5 m and not greater than 5000 m wound around a reel. In particular, for a COG, an anisotropic conductive film in which no omissions in conductive particles are present at an end 1P of the width in the short-side direction of the film can be obtained over the entire length of a long anisotropic conductive film with a length of not less than 5 m and not greater than 5000 m.

Connection Structure

The anisotropic conductive film of an embodiment of the present invention can be advantageously employed when anisotropically conductively connecting, by heat or light, a first electronic component, such as an FPC, an IC chip, or an IC module, to a second electronic component, such as an FPC, a rigid substrate, a ceramic substrate, a glass substrate, or a plastic substrate. Additionally, first electronic components can be anisotropically conductively connected by stacking IC chips or IC modules. Connection structures formed in this way are included within the scope of the present invention.

One method for connecting electronic components using the anisotropic conductive film may be as follows, for example. One interface of the anisotropic conductive film is temporarily bonded to a second electronic component such as a wiring board. The one interface is the interface where the conductive particles are present in the vicinity in the film thickness direction. A first electronic component, such as an IC chip, is mounted on the temporarily bonded anisotropic conductive film, and thermal compression bonding is performed from the first electronic component side. This method is preferable from the standpoint of increasing the connection reliability. In addition, a connection may also be established using photocuring. Note that from the perspective of connection operation efficiency in this connect, the long-side direction of the terminal 10 of the electronic component is preferably aligned with the short-side direction of anisotropic conductive films 1A and 1B.

EXAMPLES

The present invention will be described in further detail hereinafter using examples, but the present invention is not limited by these examples.

Production of a Transfer Body Original Board for COG

First, an original board for use in the embodiments was produced as follows. Specifically, a nickel plate with a thickness of 2 mm was prepared, and cylindrical convexities (outer diameter: 4 µm, height: 4 µm, center-to-center distance: 6 µm) were formed in a hexagonal lattice pattern in a square region 50 cm on each side so as to produce a transfer body original board with a convexity surface density of 32000 convexities/mm$^2$.

Production of Film-Like Original Board

Next, a polyethylene terephthalate base material film 50 cm wide and 50 µm thick was prepared, and a photocurable resin composition containing 100 parts by mass of an acrylate resin (M208, Toagosei Co., Ltd.) and 2 parts by mass of a photopolymerization initiator (IRGACURE 184, BASF Japan) was applied to the base material film to a film thickness of 30 µm.

The nickel transfer body original board was pressed into the obtained photocurable resin composition film from the convex surface thereof, and photoirradiation was performed from the base material film side with a high-pressure mercury lamp (1000 mJ) to form a photocurable resin layer in which the convexities of the transfer body original board were transferred as concavities. This operation was continuously repeated while aligning the unit with the long-side direction of the base material film to obtain a film-like original board of approximately 10 m in which the convexities of the transfer body original board were transferred as concavities. Concavities corresponding to the convexity pattern of the transfer body original board were arranged in a hexagonal lattice form on the obtained film-like original board.

One thousand regions of 1 mm$^2$ of the obtained film-like original board were discretionarily selected, and the number of concavities in each region was counted with an optical microscope. The total number counted in each region was then divided by the total area of the regions to calculate the concavity surface density. As a result, the concavity surface density was 32000 concavities/mm$^2$, which was the same as the surface density of the convexity pattern of the transfer body original board.

Production of COG Compatible Anisotropic Conductive Film

Filling Film-Like Original Board with Conductive Particles

Metal-coated resin particles (Sekisui Chemical Co., Ltd., AUL703, average particle diameter: 3 µm) were prepared as conductive particles, and after these conductive particles were scattered a plurality of times over the surface of the film-like original board, the conductive particles were wiped away with a cloth so as to fill the concave portions of the film-like original board cut out to 30 cm in the length direction with the conductive particles. The cutting locations were a total of five sections at the starting point, the end point, and three locations including a point between the starting point and the end point. Here, to ensure that conductive particles that do not fill the concavities are present on the resin mold, the number of conductive particles to be scattered or the number of times the particles were scattered was adjusted to obtain a region in which the conductive particles were in a prescribed omission state.

Production of Film for Insulating Resin Layer and Film for Second Insulating Resin Layer To determine a resin formula suitable for COG, a film for an insulating resin layer (thickness: 4 µm) and a film for a second insulating resin layer (thickness: 14 µm) were respectively produced with a size of 20×30 cm from insulating binders A1 to A4 and insulating binder B by mixing the resin compositions of the formulas illustrated in Table 1, applying the resin compositions to PET films subjected to release treatment, and drying the films.

TABLE 1

| | | (Part by mass) | | | |
|---|---|---|---|---|---|
| | | A1 | A2 | A3 | A4 |
| Insulating binders A1 to A4 | Phenoxy resin (YP-50, Nippon Steel & Sumikin Chemical Co., Ltd.) | 50 | 45 | 40 | 37 |
| | Silica filler (Aerosil R805, Nippon Aerosil Co., Ltd.) | 20 | 10 | 10 | 8 |
| | Liquid epoxy resin (jER828, Mitsubishi Chemical Corporation) | 25 | 40 | 45 | 50 |
| | Silane coupling agent (KBM-403, Shin-Etsu Chemical Co., Ltd.) | 2 | 2 | 2 | 2 |

TABLE 1-continued

|  |  | (Part by mass) | | | |
|---|---|---|---|---|---|
|  |  | A1 | A2 | A3 | A4 |
|  | Thermal cationic polymerization initiator (SI-60L, Sanshin Chemical Industry Co., Ltd.) | 3 | 3 | 3 | 3 |
| Insulating binder B | Phenoxy resin (YP-50, Nippon Steel & Sumikin Chemical Co., Ltd.) |  |  |  | 40 |
|  | Silica filler (Aerosil R805, Nippon Aerosil Co., Ltd.) |  |  |  | 5 |
|  | Liquid epoxy resin (jER828, Mitsubishi Chemical Corporation) |  |  |  | 50 |
|  | Silane coupling agent (KBM-403, Shin-Etsu Chemical Co., Ltd.) |  |  |  | 2 |
|  | Thermal cationic polymerization initiator (SI-60L, Sanshin Chemical Industry Co., Ltd.) |  |  |  | 3 |

Transfer of Conductive Particles to Insulating Resin Layer

The film for an insulating resin layer described above was applied to the cut out film-like original board that was filled with conductive particles under prescribed positions while aligning the film so that the lengths in the long-side direction matched and so that the width direction included the vicinity of the central portion of the film-like original board, and this was pressed at 60° C. and 0.5 MPa to transfer the conductive particles. The film for an insulating resin layer was then peeled from the film-like original board, and the conductive particles on the film for an insulating resin layer were pressurized (pressing conditions: 60 to 70° C., 0.5 MPa) to press the particles into the film for an insulating resin layer. The film for a second insulating resin layer was further laminated on the conductive particle transfer surface. This was performed at five points of the cut out film-like original board to produce anisotropic conductive films (ACF1 to ACF4) with conductive particles embedded in the state illustrated in FIG. 8. In this case, the embedding of the conductive particles was controlled by the pressing conditions. When the embedded state of conductive particles was observed using the five points of the film-like original board cut out to 30 cm in the long-side direction prepared in this way as a single set, the concavities were all observed in a single set around the exposed portions of the embedded conductive particles or directly above the embedded conductive particles, as illustrated in Table 2. In addition, the film shape of ACF4 could not be maintained when the conductive particles were pressed into the film. It was thus understood that ACF1 to ACF3 can be applied to COG. Note that the embedded state of the conductive particles was confirmed before the insulating binder B was laminated. In addition, omissions in conductive particles were observed and confirmed for ACF1 to ACF3 by analyzing images obtained with a CCD image sensor using image analysis software (WinROOF, Mitani Corporation). As a result, a plurality of omissions, including not more than 5 consecutive omissions in the length direction of the film (maximum length of the distance between particles: not greater than 33 μm, total of the bump width and gap between bumps described below: smaller than 38 μm) and not more than 7 omissions in the width direction (maximum length of the distance between particles: not greater than 45 μm), were present. The rectangular region of 33 μm in the length direction of the film and 38 μm in the width direction of the film can be considered the permissible omissions. Accordingly, cases in which each dimension is smaller than this are recognized as permissible omissions. Note that omissions in the width direction were present with spacing therebetween by a bump length of not less than 50 μm.

TABLE 2

| | | COG evaluation | | | |
|---|---|---|---|---|---|
| | | ACF1 | ACF2 | ACF3 | ACF4 |
| | Resin composition | A1, B | A2, B | A3, B | A4, B |
| | Film shape after pressing of conductive particles | OK | OK | OK | NG |
| | Conductive particle diameter: D (μm) | 3 | 3 | 3 | 3 |
| | Disposition of conductive particles | Hexagonal lattice | Hexagonal lattice | Hexagonal lattice | Hexagonal lattice |
| | Center distance of closest conductive particles (μm) | 6 | 6 | 6 | 6 |
| Thickness (μm) | Insulating resin binder layer ($L_a$) | 4 | 4 | 4 | 4 |
| | Insulating adhesive layer | 14 | 14 | 14 | 14 |
| | La/D | 1.3 | 1.3 | 1.3 | 1.3 |
| Minimum melt viscosity (Pa·s) | Insulating resin binder layer | 8000 | 2000 | 1500 | 800 |
| | Insulating adhesive layer | 800 | 800 | 800 | 800 |
| | Total melt viscosity | 1200 | 900 | 900 | 800 |
| Viscosity at 60° C. (Pa·s) | Insulating resin binder layer | 12000 | 3000 | 2000 | 1100 |
| Embedded state of conductive particles | | | | | |
| Embedding rate (100 × Lb/D)% | | >80 | >95 | >95 | — |
| Exposed diameter Lc (μm) | | <2.8 | <2.5 | <2.5 | — |
| Presence or absence of concavities (3b, 3c) | | Present | Present | Present | — |
| Maximum depth Le of concavities (3b, 3c) (Ratio with respect to conductive particle diameter D) | | <50% | <50% | <50% | — |

TABLE 2-continued

| | COG evaluation | | | |
|---|---|---|---|---|
| | ACF1 | ACF2 | ACF3 | ACF4 |
| Maximum diameter Ld of concavities (3b, 3c) (Ratio with respect to conductive particle diameter D) | <1.3 | <1.3 | <1.3 | — |

Production of Anisotropic Conductive Film for COG Taking into Consideration Omissions in Conductive Particles Next, slits with a width of 1.8 mm were formed so that the "conductive particle omission states" (see FIGS. 4 and 10: LQ (μm), LR (μm), LQ/W (%), LR/W (%)) of Examples 1 to 4 and Comparative Example 1 shown in Table 3 were reflected. Note that when not obtained, three types of each anisotropic conductive film were produced by repeating the production operations of ACF1 to ACF3 for each of the examples and the comparative example while adjusting the scattered amount of conductive particles or the like. For the anisotropic conductive films of each of the examples and the comparative example, a slit with a width of 1.8 mm was formed so that the position of LR (width of nonstandard section (region in which no conductive particles are present)) was the center of the film. Here, a nonstandard section includes a region a rectangular region in which any one edge is large and no conductive particles are present in a rectangular region of permissible omissions with a size of 33 μm in the film length direction and 38 μm in the film width direction, or a region to which the rectangular region of permissible omissions described above approaches within 50 μm in the width direction.

Initial Conductivity

Using the following IC for evaluation (see FIG. 10) and a glass substrate as electronic components to be subjected to COG connection, the anisotropic conductive film to be evaluated was interposed between the IC for evaluation and the glass substrate and pressurized while heating (180° C., 60 MPa, 5 sec) to obtain each connected object for evaluation. In this case, the components were joined so that the long-side direction of the anisotropic conductive film and the short-side direction of the bumps were aligned and so that a pair of standard regions of the anisotropic conductive film were positioned at both ends in the short-side direction of the IC chip. The conduction resistance of the obtained connection structure was measured with a four-terminal method (JIS K7194) using a digital multimeter (34401A, Agilent Technologies Japan). For practical purposes, the resistance is preferably not greater than 2Ω.

Conduction Reliability

After the connection structures used for the measurement of initial conduction resistance were placed in a thermostatic chamber at 85° and 85% humidity for 500 hours, the conduction resistance was once again measured. For practical purposes, the resistance is preferably not greater than 5Ω.

TABLE 3

| | (Unit) | Example 1 | Example 2 | Example 3 | Example 4 | Comparative Example 1 |
|---|---|---|---|---|---|---|
| Distance between IC bump arrangements (μm) | (μm) | 1000 | 1000 | 1000 | 1000 | 1000 |
| Distance V between IC end and bump end (FIG. 10) (μm) | (μm) | 300 | 300 | 300 | 300 | 300 |
| Length LQ (μm) of standard region (one side) in film width direction | (μm) | 600 | 450 | 400 | 350 | 140> |
| LR | (μm) | 600 | 900 | 1000 | 1100 | 1600< |
| LQ/W | (%) | 33 | 25 | 22 | 19 | 7.7< |
| LR/W | (%) | 33 | 50 | 56 | 61 | 89 |
| Ratio of long-side direction of terminals not in LR | (%) | 0 | 0 | 0 | 50 | 100 |
| Number of conductive particles captured by a terminal capturing minimum number of conductive particles | | 13< | 13< | 13< | 13< | 10> |
| Initial conduction test results | | Good | Good | Good | Good | Poor |

Evaluation 1 for COG

The conduction properties (initial conductivity and conduction reliability) of connection structures obtained by forming COG connections using the three types of anisotropic conductive films produced in each of Examples 1 to 4 and Comparative Example 1 were tested and evaluated as follows.

IC for Evaluation

IC outer shape: 1.6 mm (width)×30.0 mm (length)×0.2 mm (thickness)

Gold bumps: 15 μm (height)×20 μm (width)×100 μm (length)

(One thousand gold bumps were arranged at the end in the width direction of the IC outer shape along the long-side direction of each IC outer shape with a gap of 18 μm between bumps. The distance between gold bump arrangements was 1000 μm.)

Note that FIG. 10 is a plan view of the IC for evaluation 100 from the bump formation surface side. Symbol 101 is a bump, and G is the gap between bumps. Symbol 102 represents the distance between bump arrangements. The regions A and B enclosed by dotted lines correspond to standard regions of the anisotropic conductive film, and the region C interposed therebetween corresponds to a nonstandard region of the anisotropic conductive film (region where no conductive particles are present). In addition, V represents the distance between the edge and bump end in the short-side direction of the IC chip.

Glass Substrate
   Glass material: 1737F available from Corning Inc.
   Dimensions: 30 mm×50 mm
   Thickness: 0.5 mm
   Terminal: ITO wiring Evaluation Criteria For the connection structures used in measurements, cases in which the initial conduction resistance was not greater than 2Ω and the conduction resistance after conduction reliability tests was not greater than 5Ω at all of the terminals were evaluated as "good", and other cases (cases with even a single bump deviating from the ranges described above) were evaluated as "poor". The obtained results are shown in Table 3.

As shown in Table 3, the connection structures produced using the three types of anisotropic conductive films of each of the Examples 1 to 4 exhibited good conduction properties, but in the case of Comparative Example 1, the standard regions were too small, and thus the conduction property was evaluated as poor.

Note that it was found that even when a omission region touches a part of a terminal, there are no problems from a practical standpoint as long as at least 10 and preferably at least 13 conductive particles are captured on the terminal. It was also found that although a omission region may touch a terminal arrangement, the degree of this fluctuates depending on the terminal area and should be adjusted appropriately (Example 4). In light of the above examples, it was determined that the ratio of a standard region to the film width may be not less than 13%, preferably not less than 20%, and more preferably not less than 33%.

Production of Transfer Body Original Board for FOG, Film-Like Original Board for FOG, and FOG Compatible Anisotropic Conductive Films A transfer body original board for FOG, a film-like original board for FOG, and anisotropic conductive films in which conductive particles are embedded in the state illustrated in FIG. 8 (ACF5 to ACF8 (see, Table 5)) were produced by repeating the production process for a COG compatible anisotropic conductive film with the exception of using the binders shown in Table 4 instead of the insulating resin binders shown in Table 1 and selecting conditions so that the conductive particles assume a prescribed omission state. In this case, the embedded state of the conductive particles was controlled by the pressing conditions. As a result, concavities were observed as shown in Table 5 around the exposed portions of the embedded conductive particles or directly above the embedded conductive particles. This was confirmed before the insulating binder D was laminated. Note that the film shape of ACF8 could not be maintained when the conductive particles were pressed into the film. It was thus found that ACF5 to ACF7 can be applied to FOG.

In addition, omissions in conductive particles were observed and confirmed for ACF5 to ACF7 by analyzing images obtained with a CCD image sensor using image analysis software (WinROOF, Mitani Corporation). As a result, a film with a omission state of a degree in which at least 10 conductive particles were necessarily present within a range of not greater than 200 μm in the long-side direction of the film (width direction of the terminal) (Example 5), and a film with a omission state in which only 1 or 2 conductive particles were present (Comparative Example 2), were obtained.

TABLE 4

| | | (Part by mass) | | | |
|---|---|---|---|---|---|
| | | C1 | C2 | C3 | C4 |
| Insulating binders C1 to C4 | Phenoxy resin (YP-50, Nippon Steel & Sumikin Chemical Co., Ltd.) | 55 | 45 | 25 | 5 |
| | Phenoxy resin (FX-316ATM55, Nippon Steel & Sumikin Chemical Co., Ltd.) | | | 20 | 40 |
| | Bifunctional acrylate (A-DCP, Shin-Nakamura Chemical Co., Ltd.) | 20 | 20 | 20 | 20 |
| | Bifunctional urethane acrylate oligomer (UN-9200A, Negami Chemical Industrial Co., Ltd.) | 25 | 35 | 35 | 35 |
| | Silane coupling agent (A-187, Momentive Performance materials Inc.) | 1 | 1 | 1 | 1 |
| | Phosphoric acid methacrylate (KAYAMER PM-2, Nippon Kayaku Co., Ltd.) | 1 | 1 | 1 | 1 |
| | Benzoyl peroxide (Nyper BW, NOF Corporation) | 5 | 5 | 5 | 5 |
| Insulating binder D | Phenoxy resin (FX-316ATM55, Nippon Steel & Sumikin Chemical Co., Ltd.) | | 50 | | |
| | Bifunctional acrylate (A-DCP, Shin-Nakamura Chemical Co., Ltd.) | | 20 | | |
| | Bifunctional urethane acrylate oligomer (UN-9200A, Negami Chemical Industrial Co., Ltd.) | | 30 | | |
| | Silane coupling agent (A-187, Momentive Performance materials Inc.) | | 1 | | |
| | Phosphoric acid methacrylate (KAYAMER PM-2, Nippon Kayaku Co., Ltd.) | | 1 | | |
| | Benzoyl peroxide (Nyper BW, NOF Corporation) | | 5 | | |

TABLE 5

| | FOG evaluation | | | |
|---|---|---|---|---|
| | ACF5 | ACF6 | ACF7 | ACF8 |
| Resin composition | C1, D | C2, D | C3, D | C4, D |
| Film shape after pressing of conductive particles | OK | OK | OK | NG |
| Conductive particle diameter: D (μm) | 3 | 3 | 3 | 3 |
| Disposition of conductive particles | Hexagonal lattice | Hexagonal lattice | Hexagonal lattice | Hexagonal lattice |

TABLE 5-continued

|  |  | FOG evaluation | | | |
|---|---|---|---|---|---|
|  |  | ACF5 | ACF6 | ACF7 | ACF8 |
|  | Center distance of closest conductive particles (μm) | 6 | 6 | 6 | 6 |
| Thickness (μm) | Insulating resin binder layer (La) | 4 | 4 | 4 | 4 |
|  | Insulating adhesive layer | 14 | 14 | 14 | 14 |
|  | La/D | 1.3 | 1.3 | 1.3 | 1.3 |
| Minimum melt viscosity (Pa · s) | Insulating resin binder layer | 8000 | 2000 | 1500 | 800 |
|  | Insulating adhesive layer | 800 | 800 | 800 | 800 |
|  | Total melt viscosity | 1200 | 900 | 900 | 800 |
| Viscosity at 60° C. | Insulating resin binder layer | 12000 | 3000 | 2000 | 1100 |
|  | Embedded state of conductive particles |  |  |  |  |
|  | Embedding rate (100 × Lb/D)% | >80 | >95 | >95 | — |
|  | Exposed diameter Lc (μm) | <2.8 | <2.5 | <2.5 | — |
|  | Presence or absence of concavities (3b, 3c) | Present | Present | Present | — |
|  | Maximum depth Le of concavities (3b, 3c) (Ratio with respect to conductive particle diameter D) | <50% | <50% | <50% | — |
|  | Maximum diameter Ld of concavities (3b, 3c) (Ratio with respect to conductive particle diameter D) | <1.3 | <1.3 | <1.3 | — |

Production of Anisotropic Conductive Film for FOG Taking into Consideration Omissions in Conductive Particles Next, five anisotropic conductive films per set (ACF5 to ACF7) cut to 20×30 cm were respectively slit to a width of 2 mm. Films in which at least 10 conductive particles were necessarily present within a range of 200 μm in the long-side direction of the film (width direction of the terminal) over a 20 mm region of films extracted from 5 discretionarily selected locations (total of 25 locations for 5 films) of these films were prepared as anisotropic conductive films of Example 5. In addition, an anisotropic conductive film of Comparative Example 2 was obtained by repeating the same operation with the exception of including a region with 1 or 2 conductive particles.

Evaluation 2 for FOG

The conduction properties (initial conductivity and conduction reliability) of connection structures obtained by forming FOG connections using the three types of anisotropic conductive films produced in each of Example 5 and Comparative Example 2 were tested and evaluated as follows.

Initial Conductivity

Using the following FPC for evaluation and a glass substrate as electronic components to be subjected to FOG connection, each anisotropic conductive film to be evaluated was cut out and interposed so that the previously arbitrarily extracted 25 sections were between the FPC for evaluation and the glass substrate, and then was pressed-heated (180° C., 4.5 Mpa, 5 seconds), whereby each connected object for evaluation was obtained. In this case, the components were joined so that the long-side direction of the anisotropic conductive film and the short-side direction of the bumps were aligned. The conduction resistance of the obtained connection structure was measured with a four-terminal method (JIS K7194) using a digital multimeter (34401A, Agilent Technologies Japan). For practical purposes, the resistance is preferably not greater than 2Ω.

Conduction Reliability

After the connection structures used for the measurement of initial conduction resistance were placed in a thermostatic chamber at 85° and 85% humidity for 500 hours, the conduction resistance was once again measured. For practical purposes, the resistance is preferably not greater than 5Ω.

FPC for Evaluation

Tin-plated copper wiring (L/S=200/200) with a thickness of 8 μm and a pitch of 400 μm formed on a polyimide substrate with a thickness of 38

Glass Substrate

Glass material: 1737F available from Corning Inc.
Dimensions: 30 mm×50 mm
Thickness: 0.5 mm
Terminal: ITO wiring Evaluation Results For the connection structures used in measurements, cases in which the initial conduction resistance was not greater than 2Ω and the conduction resistance after conduction reliability tests was not greater than 5Ω were evaluated as "good", and other cases were evaluated as "poor". As a result, the conduction properties of the connection structures produced using the three types of anisotropic conductive films of Example 5 were good, whereas the connection structure produced using the anisotropic conductive film of Comparative Example 2 had a greater amount of nonstandard regions present in the regular disposition region than in Example 5, and thus the conduction properties were evaluated as poor.

INDUSTRIAL APPLICABILITY

The anisotropic conductive film of an embodiment of the present invention includes a regular disposition region in which conductive particles are disposed regularly in an insulating resin binder, and the length is 5 m or greater. Moreover, a standard region including no sections with more than a prescribed number of consecutive omissions in conductive particles is present in the regular disposition region over a prescribed width in a short-side direction of the anisotropic conductive film and at least a prescribed length in a long-side direction of the anisotropic conductive film. Therefore, even in a case where omissions are present in a prescribed regular disposition of conductive particles, the film can be used for anisotropic conductive connections in substantially the same manner as an anisotropic conductive film without omissions. The anisotropic conductive film of an embodiment of the present invention is useful as a junction member for low-cost anisotropic conductive connection.

REFERENCE SIGNS LIST 1, 1A, 1B, 1C Anisotropic conductive film
1P End of the width in the short-side direction of the anisotropic conductive film
2, 2a, 2b, 2c, 2d Conductive particle
2t Apical part of conductive particle
2X Omission of conductive particle
2Y Portion including consecutive omission
3 Insulating resin binder
3a Surface of insulating resin binder in central portion between adjacent conductive particle
3b, 3c Concavity
3p Tangential plane
4 Insulating adhesive layer
5 Repeating unit
10 Bump, terminal
11 Terminal array
12 Electronic component
D Average particle diameter of conductive particle
L1 Lattice axis
La Thickness of insulating resin binder
Q Standard region
R Region including nonstandard section
S Discretionarily selected region

The invention claimed is:
1. An anisotropic conductive film having a regular disposition region in which conductive particles are disposed regularly in an insulating resin binder,
wherein the anisotropic conductive film is formed on a release film, and
a standard region including no sections with more than a prescribed number of consecutive omissions in conductive particles is present in the regular disposition region over a prescribed width in a short-side direction of the anisotropic conductive film and at least a prescribed length in a long-side direction of the anisotropic conductive film.
2. The anisotropic conductive film according to claim 1, wherein the anisotropic conductive film is formed long.
3. The anisotropic conductive film according to claim 1, wherein the prescribed width in a short-side direction of the anisotropic conductive film is not less than 10% and not greater than 95% of the entire width in a short-side direction of the anisotropic conductive film, and the prescribed length in a long-side direction of the anisotropic conductive film is not less than 5 mm and not greater than 1000 m.
4. The anisotropic conductive film according to claim 2, wherein the prescribed width in a short-side direction of the anisotropic conductive film is not less than 10% and not greater than 95% of the entire width in a short-side direction of the anisotropic conductive film, and the prescribed length in a long-side direction of the anisotropic conductive film is not less than 5 mm and not greater than 1000 m.
5. The anisotropic conductive film according to claim 3, wherein the prescribed width in a short-side direction of the anisotropic conductive film is not less than 20% and not greater than 90% of the entire width in the short-side direction of the anisotropic conductive film.
6. The anisotropic conductive film according to claim 4, wherein the prescribed width in a short-side direction of the anisotropic conductive film is not less than 20% and not greater than 90% of the entire width in the short-side direction of the anisotropic conductive film.
7. The anisotropic conductive film according to claim 1, wherein the number density of the conductive particles is not less than 30 particles/mm$^2$ and not greater than 50000 particles/mm$^2$.
8. The anisotropic conductive film according to claim 7, wherein the number density of the conductive particles is not less than 500 particles/mm$^2$ and not greater than 35000 particles/mm$^2$.
9. The anisotropic conductive film according to claim 1, wherein the regular disposition region and the standard region are aligned.
10. The anisotropic conductive film according to claim 1, wherein nonstandard sections are present, the nonstandard sections being sections including at least a prescribed number of consecutive omissions in conductive particles.
11. The anisotropic conductive film according to claim 1, wherein ten or more conductive particles are present in a discretionarily selected region of 200 μm in the long-side direction over the entire width of the anisotropic conductive film.
12. The anisotropic conductive film according to claim 1 including a standard region along at least an end region in the short-side direction of the anisotropic conductive film.
13. The anisotropic conductive film according to claim 1, wherein the anisotropic conductive film is a wound body which is wound around a reel.
14. A method for producing an anisotropic conductive film, wherein a wide base material of the anisotropic conductive film including conductive particles disposed regularly in an insulating resin binder, the anisotropic conductive film being formed on a release film, is cut in a length direction such that no nonstandard sections including at least a prescribed number of consecutive omissions in conductive particles are included in a regular disposition, or such that nonstandard sections are at intended positions in a short-side direction of the film.
15. A method for producing an anisotropic conductive film, wherein nonstandard sections including at least a prescribed number of consecutive omissions in conductive particles are removed from an anisotropic conductive film including a regular disposition region in which conductive particles are disposed regularly in an insulating resin binder, the anisotropic conductive film being formed on a release film, and the anisotropic conductive films after removal are connected to each other.
16. A connection structure, wherein a first electronic component including a terminal array and a second electronic component including a terminal array are anisotropically conductively connected via an anisotropic conductive film including a regular disposition region in which conductive particles are disposed regularly in an insulating resin binder, the anisotropic conductive film being formed on a release film, and
in the anisotropic conductive film, a standard region including no sections with more than a prescribed number of consecutive omissions in conductive particles is present in the regular disposition region over a prescribed width in a short-side direction of the anisotropic conductive film and at least a prescribed length in a long-side direction of the anisotropic conductive film.

17. A method for producing a connection structure, comprising establishing an anisotropic conductive connection between terminal arrays of a first electronic component and a second electronic component by subjecting the first electronic component including a terminal array and the second electronic component including a terminal array to thermocompression bonding via an anisotropic conductive film including a regular disposition region in which conductive particles are disposed regularly in an insulating resin binder, the anisotropic conductive film being formed on a release film, wherein an anisotropic conductive film in which a standard region including no sections with more than a prescribed number of consecutive omissions in conductive particles is formed in the regular disposition region over a prescribed width in a short-side direction of the anisotropic conductive film and at least a prescribed length in a long-side direction of the anisotropic conductive film is used as the anisotropic conductive film.

18. The method for producing a connection structure according to claim 17, wherein the standard region is aligned with the terminal arrays of the electronic components.

19. The method for producing a connection structure according to claim 18, wherein when the first electronic component and the second electronic component respectively have a plurality of terminal arrays and the standard regions are formed in an array on the anisotropic conductive film, a region between the adjacent standard regions is aligned with a region between the terminal arrays.

* * * * *